(12) United States Patent
Wang

(10) Patent No.: US 9,698,708 B2
(45) Date of Patent: Jul. 4, 2017

(54) FUEL-FREE NANOWIRE MOTORS

(75) Inventor: Joseph Wang, San Diego, CA (US)

(73) Assignee: The Regents of the University of California, Oakland, CA (US)

(*) Notice: Subject to any disclaimer, the term of this patent is extended or adjusted under 35 U.S.C. 154(b) by 937 days.

(21) Appl. No.: 13/876,470

(22) PCT Filed: Sep. 28, 2011

(86) PCT No.: PCT/US2011/053783
§ 371 (c)(1),
(2), (4) Date: Jun. 4, 2013

(87) PCT Pub. No.: WO2012/050928
PCT Pub. Date: Apr. 19, 2012

(65) Prior Publication Data
US 2013/0241344 A1    Sep. 19, 2013

Related U.S. Application Data

(60) Provisional application No. 61/387,427, filed on Sep. 28, 2010.

(51) Int. Cl.
*H02K 35/00* (2006.01)
*H02N 11/00* (2006.01)
(Continued)

(52) U.S. Cl.
CPC ........... *H02N 11/006* (2013.01); *B82B 1/002* (2013.01); *H01L 29/872* (2013.01); *H01L 43/12* (2013.01);
(Continued)

(58) Field of Classification Search
CPC ........ H02K 35/00; B82Y 10/00; B82Y 30/00; B82Y 40/00; B82B 1/00; B82B 3/00
See application file for complete search history.

(56) References Cited

U.S. PATENT DOCUMENTS

2008/0187764 A1    8/2008 Jung et al.
2009/0212275 A1    8/2009 Park et al.
(Continued)

OTHER PUBLICATIONS

Calvo-Marzal, P. et al. "Propulsion of nanowire diodes," Chem. Comm., 2010, pp. 1623-1624.
(Continued)

*Primary Examiner* — Dang Le
(74) *Attorney, Agent, or Firm* — Perkins Coie LLP

(57) ABSTRACT

Techniques and systems are disclosed for locomoting fuel-free nanomotors in a fluid. In one aspect of the disclosed technology, a system for locomoting fuel-free nanomotors can include an electrically-driven nanowire diode formed of two or more segments of different electrically conducting materials, a fluid container, and a mechanism that produces an electric field to drive the nanowire diode to locomote in the fluid. In another aspect, a system for locomoting fuel-free nanomotors can include a magnetically-propelled multi-segment nanowire motor formed of a magnetic segment and a flexible joint segment, a fluid container, and a mechanism that generates and controls a magnetic field to drive the multi-segment nanowire motor to locomote in the fluid. The disclosed fuel-free nanomotors can obviate fuel requirements and can be implemented for practical in vitro and in vivo biomedical applications.

23 Claims, 10 Drawing Sheets

(51) Int. Cl.
  *H01L 29/872* (2006.01)
  *H01L 43/12* (2006.01)
  *B82Y 10/00* (2011.01)
  *B82Y 30/00* (2011.01)
  *B82Y 40/00* (2011.01)
  *B82B 1/00* (2006.01)
  *B82B 3/00* (2006.01)

(52) U.S. Cl.
  CPC ............ *H02K 35/00* (2013.01); *B82B 1/00* (2013.01); *B82B 3/00* (2013.01); *B82Y 10/00* (2013.01); *B82Y 30/00* (2013.01); *B82Y 40/00* (2013.01)

(56) References Cited

U.S. PATENT DOCUMENTS

| | | | | |
|---|---|---|---|---|
| 2012/0135158 | A1* | 5/2012 | Freer | B82Y 10/00 427/532 |
| 2013/0203242 | A1* | 8/2013 | Samuelson | B82Y 10/00 438/466 |
| 2014/0162870 | A1* | 6/2014 | Wang | B82Y 30/00 502/325 |
| 2015/0013304 | A1* | 1/2015 | Wang | F03G 7/005 60/204 |

OTHER PUBLICATIONS

Chang, T. et al. "Remotely powered self-propelling particles and micropumps based on miniature diodes," Nature Materials, Mar. 2007, pp. 235-240.
Dreyfus, R. et al. "Microscopic artificial swimmers," Nature, Oct. 6. 2005, pp. 862-865.
Fournier-Bidoz, S. et al. "Synthetic self-propelled nanorotors," Chem. Commun., 2005, pp. 441-443.
Gao. W. et al. "Magnetically powered flexible metal nanowire motors," Journal of the American Chemical Society, pp. 14403-14405, Sep. 29, 2010.
Geranio, L. et al. "The Behavior of Silver Nanotextiles during Washing," Environ. Sci. Technol., 2009, pp. 8113-8118.
Ghosh, A. et al. "Controlled Propulsion of Artificial Magnetic Nanostructured Propellers," Nano Letters 2009, pp. 243-2245.
Hatwalne, H. et al. "Rheology of Active-Particle Suspensions," Physical Review Letters, 2004, pp: 118101-1-118101-4.
Laocharoensuk, R. et al. "Carbon-Nanotube-Induced Acceleration of Catalytic Nanomotors," ACS Nano 2008, pp. 1069-1075.
Lauga, E. et al. "The hydrodynamics of swimming microorganisms," Reports of Progress in Physics, 2009, 36 pages.
Mallouk, E. et al. "Powering Nanorobots," Sci Amer. May 2009, pp. 72-77.
Mirkovic, T. et al. "Fuel for Thought: Chemically Powered Nanomotors Out-Swim Nature's Flagellated Bacteria," ACS Nano, 2010, pp. 782-1789.
Morgan, H. et al, AC Electrokinetics: Colloids an nanoparticles, Research Studies Press, Baldock, Hertfordshire, England, 2001.
Ozin, A. et al. "Dream Nanomachines," Advanced Materials, 2005, pp. 3011-3018.
Park, S., et al. "Hybrid Organic-Inorganic, Rod-Shaped Nanoresistors and Diodes," J. Am. Chem. Soc., 2004, pp. 11772-11773.
Paxton, F. et al. "Chemical Locomotion," Angew. Chemie. Int. Ed., 2006, pp. 5420-5429.
Paxton, W. et al. "Catalytic Nanomotors: Autonomous Movement of Striped Nanorods," J. Am. Chem. Soc. 2004, pp. 13424-13431.
Paxton, W. et al, "Catalytically Induced Electrokinetics for Motors and Micropumps," J. Am. Chem. Soc. 2006, pp. 14881-14888.
Peña, D. et al. "Template Growth of Photoconductive Metal-CdSe-Metal Nanowires," J. Phys. Chem. B, 2002, pp. 7458-7462.
Purcell, E., "Life at low Reynolds number," Am. J. Phys. 1977, pp. 3-11.
Schierhorn, M. et al. "Fabrication and Electrochemical Photovoltaic Response of CdSe Nanorod Arrays," J. Phys. Chem. C, 2008, pp. 8516-8520.
Schierhorn, M. et al. "Photoelectrochemical Performance of CdSe Nanorod Arrays Grown on a Transparent Conducting Substrate," Nano Letters, 2009, pp. 3262-3297.
Silverman, M. et al. "Flagellar rotation and the mechanism of bacterial motility," Nature Vol, May 3, 1974, pp. 73-74.
Sun, X. et al. "Cylindrical Silver Nanowires: Preparation, Structure, and Optical Properties," Adv. Mater. 2005, pp. 2626-2630.
Velev, D. et al. "Particle-localized AC and DC manipulation and electrokinetics" Annu. Rep. Prog. Chem., Sect. C, 2009, pp. 213-246.
Wang, J. "Can Man-Made Nanomachines Compete with Nature Biomotors?," ACS Nano, 2009, pp. 4-9.
Zhang, L. et al., Controlled propulsion and cargo transport or rotating nickel nanowires near a patterned solid surface, ACS Nano vol. 4, No. 10, Sep. 27, 2010, pp. 6228-6234.
Zhang, L. et al. "Artificial bacterial flagella: Fabrication and magnetic control," Applied Physical Letters, 2009, 94, 4 pages.

* cited by examiner

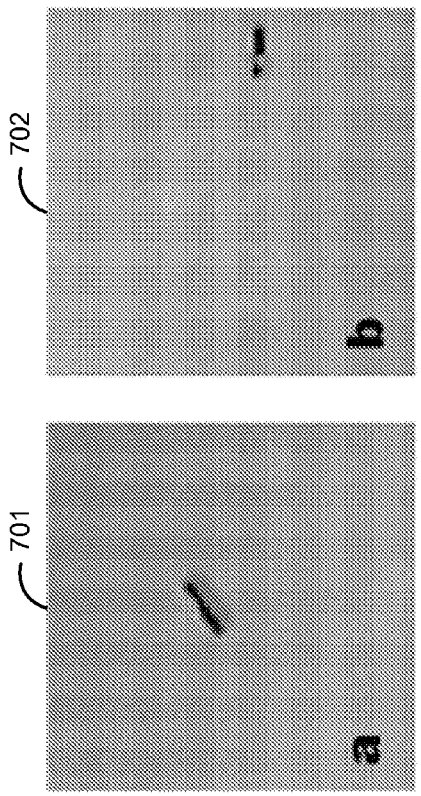
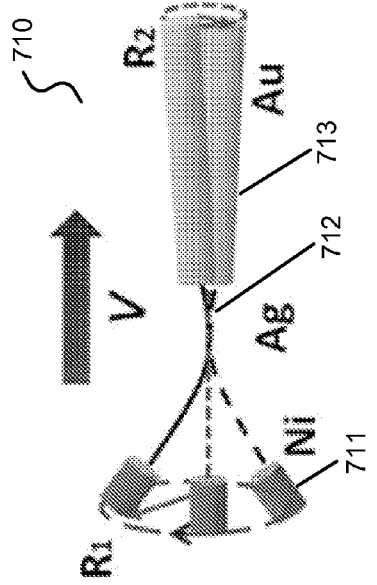
FIG. 7A
FIG. 7B
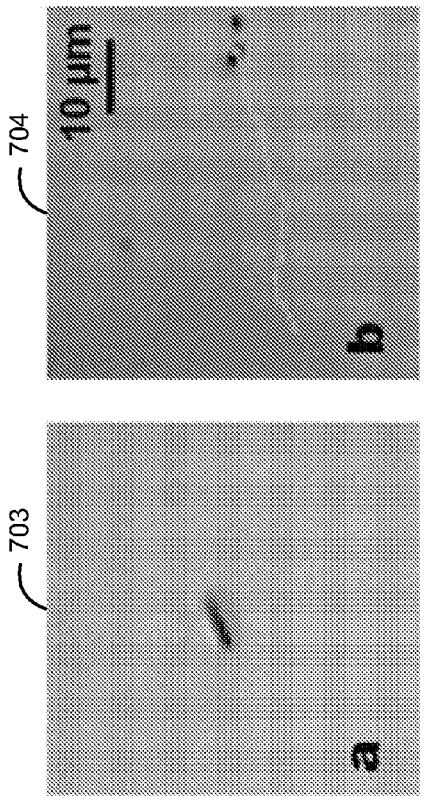
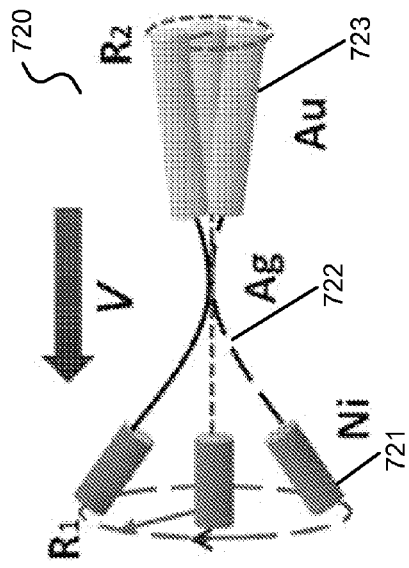
FIG. 7C
FIG. 7D

FIG. 10A
FIG. 10B
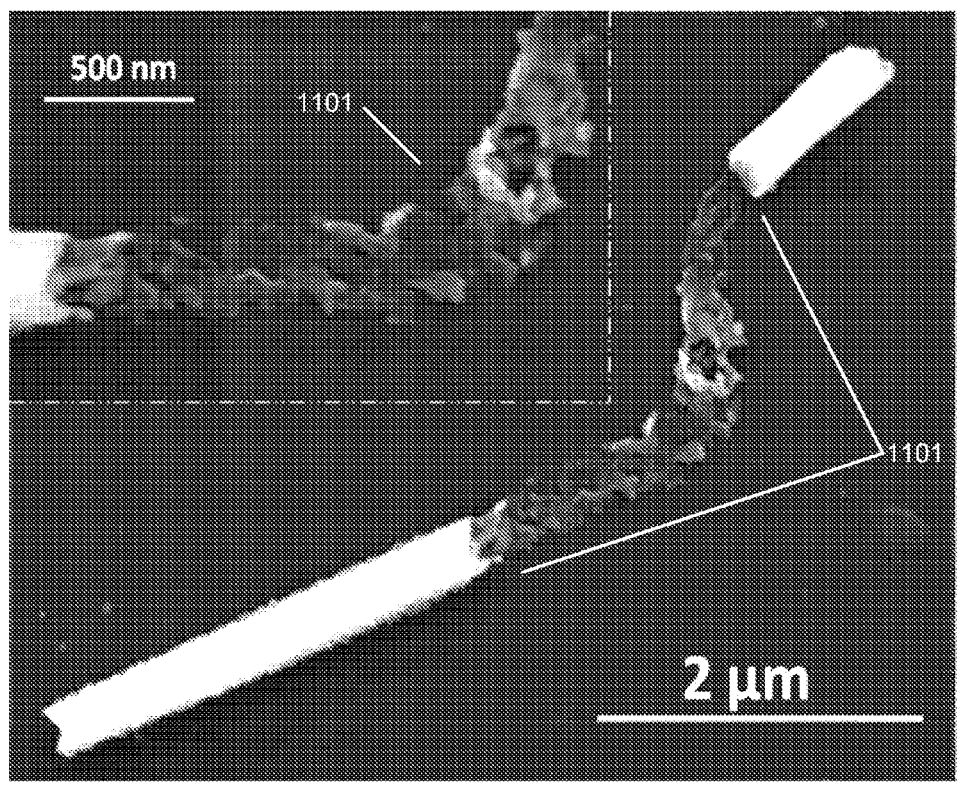
FIG. 11

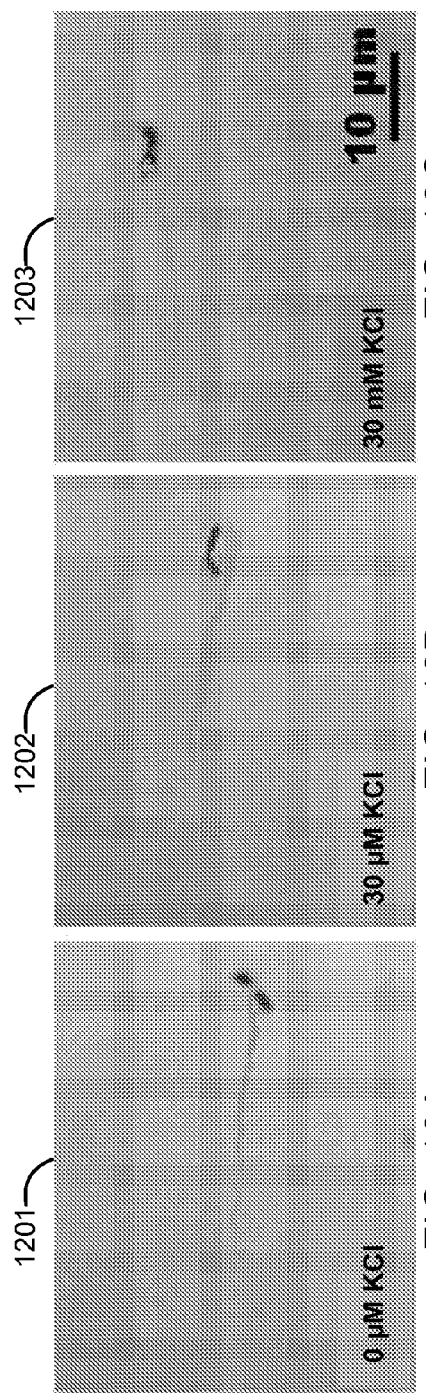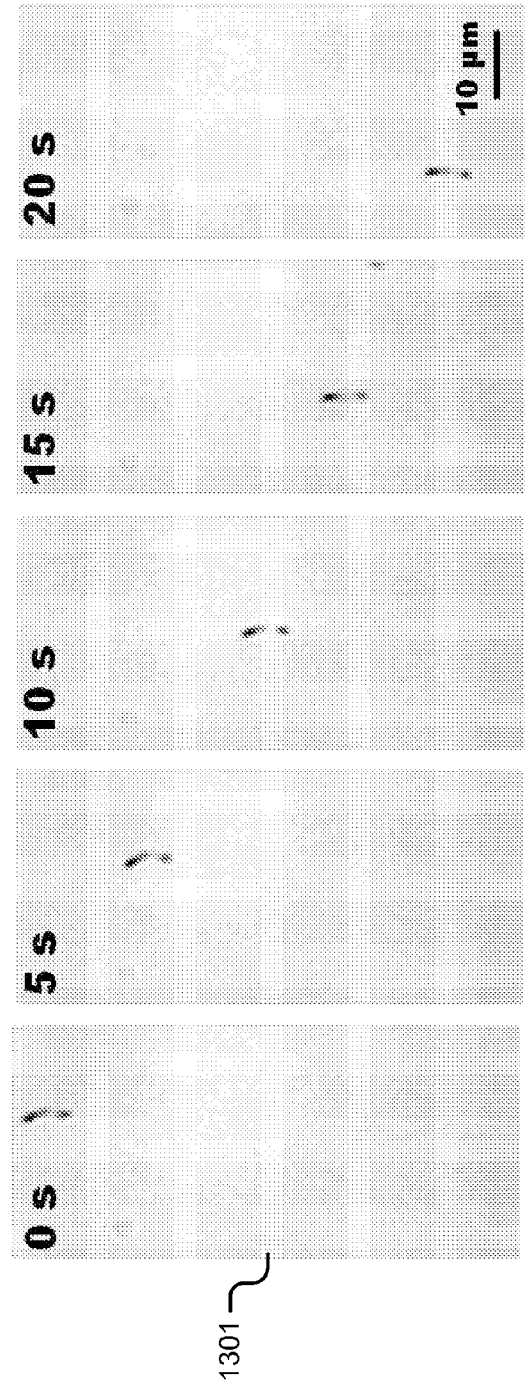
FIG. 12A  FIG. 12B  FIG. 12C
FIG. 13

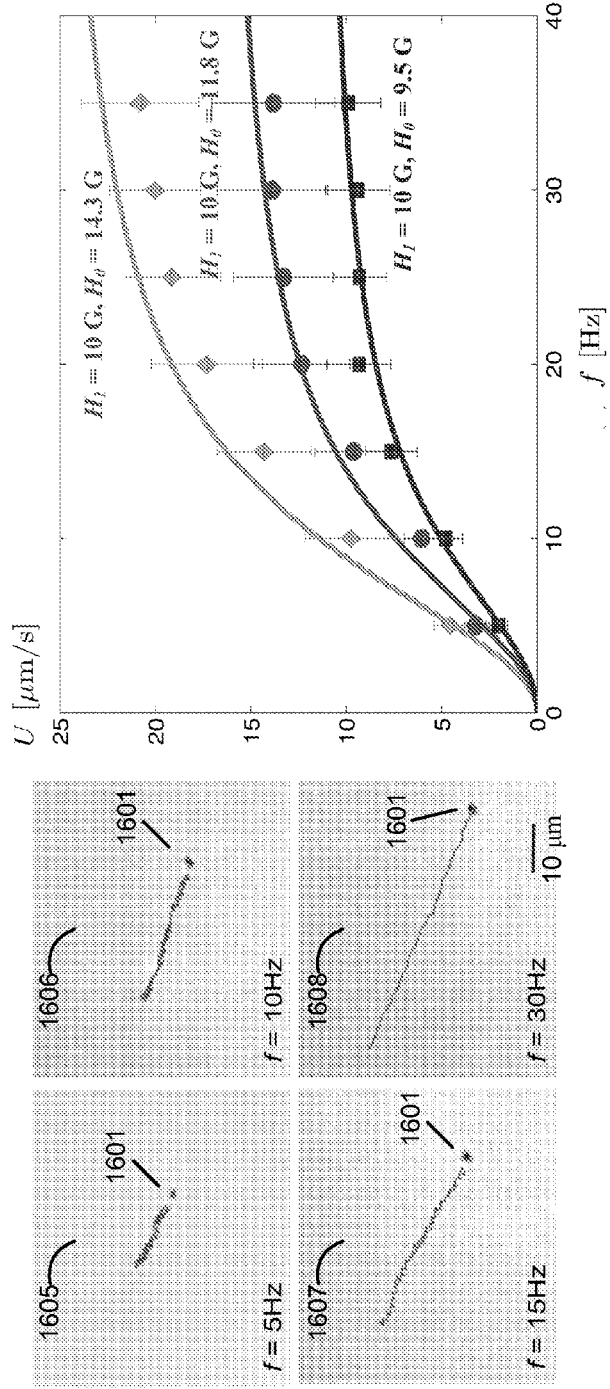
FIG. 16A
FIG. 16B
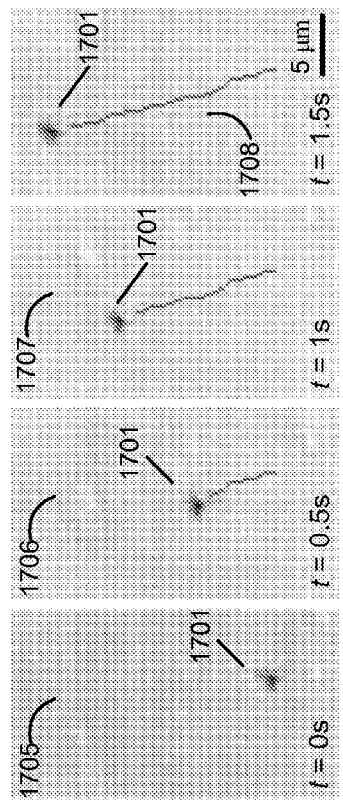
FIG. 17

FUEL-FREE NANOWIRE MOTORS

CROSS-REFERENCE TO RELATED APPLICATION

This patent document claims priority of U.S. Provisional Patent Application No. 61/387,427, filed Sep. 28, 2010, and entitled "FUEL-FREE NANOWIRE MOTORS" the entire disclosure of which is incorporated herein by reference for all purposes.

FEDERALLY SPONSORED RESEARCH OR DEVELOPMENT

The invention was made with government support under Grant No. CBET 0853375 awarded by the National Science Foundation. The government has certain rights in the invention.

BACKGROUND

This patent document relates to micro- and nano-scale materials.

Micro/nano-scale propulsion in fluids can be challenging due to the absence of the inertial forces exploited by biological organisms on macroscopic scales. The difficulties are summarized by E. M. Purcell's "scallop theorem", which states that a reciprocal motion (a deformation with time-reversal symmetry) cannot lead to any net propulsion at low Reynolds numbers. The Reynolds number, $Re=\rho UL/\mu$, measures the relative importance of inertial to viscous forces, where $\rho$ and $\mu$ are the density and shear viscosity of the fluid, while U and L are the characteristic velocity and length scales of the self-propelling body. Natural microorganisms can inhabit a world where $Re \sim 10^{-5}$ (e.g., flagellated bacteria) to $10^{-2}$ (e.g., spermatozoa), and they achieve their propulsion by propagating traveling waves along their flagella (or rotating them) to break the time-reversibility requirement, and hence escape the constraints of the scallop theorem. Yet, there is a formidable challenge in engineering nanoscale, complex objects and systems capable of locomotion in fluids, which can be due to the combination of low Reynolds numbers and Brownian motion. Overcoming the challenges and limitations of micro/nano-scale propulsion in fluids can hold important implications.

SUMMARY

Techniques, systems and devices are disclosed for design and implementation of nano-scale materials for locomotion.

In one aspect of the disclosed technology, a system for locomoting a nanostructure in a fluid includes a nanostructure, a fluid container, and a mechanism that produces an electric field. A nanostructure is configured as a nanowire diode formed of two or more segments of different electrically conducting materials. A container contains a fluid surrounding the nanostructure. A mechanism produces an electric field in the fluid, such that the electric field drives the nanostructure to locomote in the fluid.

Various implementations of the above aspect can include one or more of the following features. The system can include a nanostructure that locomotes in the fluid substantially free of a chemical reaction with the two or more segments of the nanostructure. The system can include a nanowire diode that includes at least one semiconductor segment and a conductor segment. The system can include a semiconductor segment that can be of a polypyrrole (PPy) material and a conductor segment that can be of a cadmium (Cd) material. The system can include at least one semiconductor segment that can be of a cadmium selenide (CdSe) material and a conductor segment that can be of a gold (Au) material. The system can include a mechanism for producing an electric field that includes electrodes and an AC signal source coupled to the electrodes. The system can include an electric field that can be an alternating electric field, such as a uniform alternating electric field or a non-uniform alternating electric field. The system can include a fluid that can be pure water, salt concentrated water, and biological fluid. The system can include a system for tracking a locomotion pattern of a nanostructure in the fluid.

In another aspect, a method of fabricating the nanowire diode includes forming a working electrode on a surface of a porous membrane template having cylindrical pores; placing a reference electrode and a counter electrode in a plating solution; electrodepositing a semiconductor material and a conductor material into the cylindrical pores of the porous membrane template to produce a nanowire diode; and dissolving the porous membrane template to release the nanowire diode.

In another aspect, a system for locomoting a nanostructure in a fluid includes a nanostructure, a fluid container, and a mechanism that generates and controls a magnetic field. A nanostructure is configured as a multi-segment nanowire formed of a joint segment and a propeller segment, in which the propeller segment is of a magnetic material and the joint segment is of a flexible material. A container contains a fluid surrounding the nanostructure. A mechanism generates and controls a magnetic field in the fluid, such that the magnetic field drives the nanostructure to locomote in the fluid.

Various implementations of the above aspect can include one or more of the following features. The system can include a nanostructure that locomotes in the fluid substantially free of a chemical reaction with the multi-segment nanowire. The system can include a magnetic field having a rotational magnetic field that rotates the propeller segment, thereby creating a controlled elastic deformation of the joint segment in an asymmetrical manner, whereby the magnetic field drives the nanostructure to locomote in the fluid. The system can include a joint segment that can be of a metal or a polymeric material. The system can include a joint segment of a flexible silver (Ag) or polymer material and a propeller segment of a nickel (Ni) or iron oxide ($Fe_2O_3$) material. The system can include a mechanism for producing a magnetic field that includes a rotating magnet that produces a rotational magnetic field or a static magnet that produces a static magnetic field or both. The system can include a multi-segment nanowire further having a head segment, in which the head segment can be of a gold (Au) material. The system can include a head segment and the propeller segment that are configured to each have a particular length for a direction control of the nanostructure to locomote in the fluid. The system can include a mechanism for producing a magnetic field that is modulated for an on/off control and a direction control of the nanostructure to locomote in the fluid. The system can include a fluid that can be pure water, salt concentrated water, and biological fluid. The system can include a system for tracking a locomotion pattern of a nanostructure in the fluid.

In another aspect, a method of fabricating a flexible multi-segment nanowire includes sequentially depositing a first material of a magnetic material and a second material into cylindrical pores of a porous membrane template to form a non-flexible multi-segment nanowire, such that the first material is coupled to the second material; dissolving the porous membrane template to release the non-flexible bi-segment nanowire; and partially dissolving the second material to form a flexible segment that is capable of a controlled elastic deformation.

Various implementations of the above aspect can include one or more of the following features. The method can include the second material of a flexible silver (Ag) or a polymer material and the first material of a nickel (Ni) or iron oxide ($Fe_2O_3$) material. The method can further include sequentially depositing a third material into cylindrical pores of a porous membrane template to form a non-flexible multi-segment nanowire, such that the first material is coupled to the second material and the second material is coupled to the third material.

In another aspect, a nanowire diode that locomotes in a fluid under an electric field includes two or more segments formed of at least one semiconductor segment and a conductor segment. The two or more segments are structured and interfaced to form a diode that interacts with an external electric field, from which the nanowire diode locomotes in the fluid while being substantially free of a chemical reaction with the two or more segments of the nanowire diode.

In another aspect, a nanowire that locomotes in a fluid under a magnetic field includes two or more segments coupled to allow motion relative to one another, in which at least one segment is formed of a magnetic material and at least one segment is formed of a flexible material that moves relative to the magnetic material when the magnetic material interacts with an external magnetic field to cause locomotion of the nanowire in the fluid substantially free of a chemical reaction with the two or more segments of the nanowire The subject matter described in this patent document potentially can provide one or more of the following advantages. The described fuel-free nanowire motors can obviate the fuel requirement of chemically-powered nanomotors and hence hold considerable promise for practical in vitro and in vivo biomedical applications. Development and implementation of artificial micro/nano-sized machines and locomotive systems could hold great promise toward major technological advances, such as biomedical applications including targeted drug delivery and microsurgery.

BRIEF DESCRIPTION OF THE DRAWINGS

FIGS. 7A, 7B, 7C, and 7D show a comparison of rigid Au—Ag—Ni and flexible Au—$Ag_{flex}$—Ni nanowires and 'forward' and 'backward' movement under a rotating magnetic field.

FIGS. 10A and 10B show backscattered SEM images of Au—Ag—Ni nanowires configured for 'forward' and 'backward' movement before dissolving silver.

FIG. 11 shows an SEM image of a Au—Ag—Ni nanowire featuring the central Ag segment.

FIGS. 12A, 12B, and 12C show images with track lines of 'backward' movement of a flexible Au—$Ag_{flex}$—Ni nanowire motor under varying salt concentrations.

FIG. 13 shows time-lapse images of 'backward' motion of a flexible Au—$Ag_{flex}$—Ni nanowire motor in a urine sample.

FIGS. 16A and 16B show motion trajectories of the same nanomotor at different magnetic field frequencies.

FIG. 17 shows time lapse images of a flexible $Ag_{flex}$—Ni nanowire motor in human serum.

Like reference symbols and designations in the various drawings indicate like elements.

DETAILED DESCRIPTION

Figure 1A:
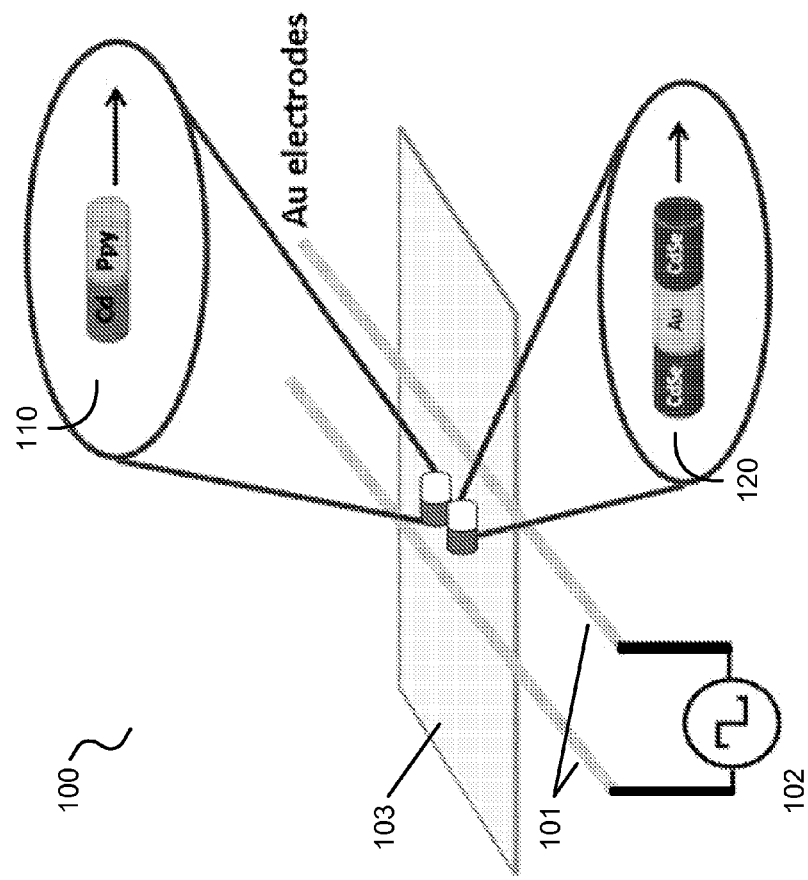
FIGS. 1A, 1B, and 1C show fuel-free nanowire diodes and a system for their electrically-driven propulsion.

The techniques, devices and systems described in this patent document can be used to design, fabricate, and implement fuel-free locomotive micro- and nano-sized materials based on multi-segment nanowires and magnetic or electrical controls.

Nanomotors are artificial small-scale structures or devices that move by converting other energy into the motion of the nanomotors in a liquid and can have many potential uses and applications, including powering nanomachines and nanofactories. Some nanomotors are designed to include catalytic nanowire motors that exhibit autonomous self propulsion in the presence of a fuel, e.g., hydrogen peroxide fuel, where the chemical reaction between the catalytic material of the motors and the fuel generates power to propel the motors. Such nanomotors are part of chemically-powered nanomotors which generally can deliver high propulsion speeds. However, the requirements for having chemical fuels and reactions may limit their uses in various biological or chemical environments. Nanomotors may also be designed as fuel-free externally-powered nanomotors or propellers. For example, external fields, e.g., electric fields and/or magnetic fields, can be used to actuate motion of fuel-free externally-powered nanomotors. Various applications of nanomotors including certain biomedical applications would benefit from such fuel-free externally-powered nanomotors.

Nanomotors described in this document are fuel-free nanomotors that can locomote in a fluid. Fuel-free nanomotors can include micro- and nano-scale structures driven by external fields, from which the micro-/nano-structures can efficiently convert the energy from the external field into mechanical energy of locomotion. In some implementations, nanomotors can be synthetic nanomotors based on a multitude of propulsion mechanisms. For example, some fuel-free nanomotors described here are electrically-driven nanowire diodes, magnetically-driven flexible nanowire motors, and magnetically-driven artificial flagella-based nanowire motors.

Magnetically-propelled fuel-free nanomotors can be categorized into multiple groups according to their magnetic propulsion mechanisms. One group can include nanowires with helical propellers, as inspired by helical bacterial flagella, which can propel upon rotation imposed by external magnetic fields. Another group of propellers can rely on a surface to break the spatial symmetry and provide one additional degree of freedom to escape the constraints from the scallop theorem, and hence can be termed as surface walkers. A third type of propellers, which can be referred to as flexible propellers, exploits the deformation of flexible filaments for propulsion.

In this patent document, the disclosed fuel-free micro/nano- motors and propellers can be referred to as micro/nano- swimmers. It is noted that true self-propulsion can occur in the absence of nonzero external torques.

Some implementations of the disclosed micro/nano-scale motors are based on propulsion in a multitude of fluids, including biological fluids such as (but not limited to) aqueous humour and vitreous humour, bile, blood (blood serum, blood plasma), cerebrospinal fluid, intracellular fluid (cytoplasm) and extracellular fluid (including interstitial fluid, transcellular fluid, plasma), digestive fluid (including gastric juice and intestinal juice), lymphatic fluid and endolymph and perilymph, mucus (including nasal drainage and phlegm), peritoneal fluid, pleural fluid, saliva, sebum (skin oil), semen, sweat, tears, urine, and vaginal fluids.

Several embodiments of the fuel-free micro/nano-sized machines and locomotive systems are described herein. In one aspect of the disclosed technology, fuel-free electrically propelled nanomotors can be implemented by creating diode nanowire motors formed of two or more different conducting or semiconducting materials. Examples of diode nanowire motors include Schottky barrier diode nanowires, e.g., polypyrrole-cadmium (PPy-Cd) nanowires and cadmium selenide-gold-cadmium selenide (CdSe—Au—CdSe) nanowires. The PPy-Cd nanowires are examples of diode nanowires formed of an organic material and a metallic material, and the CdSe—Au—CdSe nanowires are examples based on different metallic and semiconducting materials. The diode nanowire motors can be propelled in a controllable fashion under the influence of a spatially uniform AC electrical field. In another aspect of the disclosed technology, fuel-free magnetically-driven nanowire motors can be implemented by creating multi-segmented flexible nanowire motors formed of two or more different materials, in which at least one material is magnetic and at least another is flexible. The flexible segment can lead to controlled mechanical deformation enabling nanowire locomotion under the influence of a magnetic field. Examples of multi-segmented flexible nanowire motors include gold-silver-nickel (Au—Ag—Ni) nanowires, in which partial dissolution of the central silver segment can produce a flexible thinner joint linking the Au 'head' and magnetically responsive Ni 'tail'. In another aspect of the disclosed technology, high-speed fuel-free magnetically-driven nanopropellers can be implemented by creating multi-segmented flexible metal nanowires, e.g., Ag—Ni nanowires, in which partial dissolution of the silver segment can produce high dimensionless propulsion velocities.

In one embodiment, the disclosed technology can include micro- and nano-scale diode nanowire motors driven by electrical propulsion, which can efficiently convert electrical energy into mechanical locomotion. Exemplary diode nanowire motors (also referred to as diode nanowires, nanowire diodes or nanodiodes) can include semiconductor diode nanowire motors and Schottky barrier diode nanowire motors. Diode nanowires can be created using template electrodeposition of hybrid organic-inorganic polymer-metal nanowire diodes and rectifiers. For example, polypyrrole-cadmium (PPy-Cd) nanowire hybrids with attractive diode properties can be prepared by template electropolymerization of PPy followed by the electrodeposition of cadmium on top of the polymeric segment. Similarly, template growth of cadmium selenide (CdSe) and gold (Au) can be performed to create exemplary CdSe—Au—CdSe photoconductive nanowires. The exemplary PPy-Cd and CdSe—Au—CdSe Schottky barrier diode nanowire motors can be propelled in a controllable fashion under the influence of a spatially uniform AC electrical field.

FIG. 1A shows an exemplary system 100 for locomoting nanowire diodes in a fluid under an electric field, without any chemical reactions with materials of the nanowire diodes. The system 100 includes two electrically conductive wires (101), e.g., gold electrodes aligned in parallel, and an electrical signal source (102) coupled to the wires (101) to produce an electrical field between the wires (101). For example, a function generator can be used to implement the source (102) for generating a spatially uniform AC electrical field that can propel diode nanowire motors, such as diode nanowire motor 110 and diode nanowire motor 120. A container (103) contains a fluid in which the nanowire diode is located and can locomote. The wires (101) can be configured inside or outside the container (103) to produce an electric field in the fluid such that diode nanowires can locomote. For example, configuration of the wires (101) can include parallel alignment of wires (101), which can produce a spatially uniform electric field. A uniform AC electric field can ensure the absence of dielectrophoretic forces on these nanostructures. Diode nanowires can be formed of two or more segments of different conducting and/or semiconducting materials. For example, one segment can include a semiconductor, e.g., an organic semiconductor like polypyrrole; the other segment can include a conductor, e.g., a conducting metal like cadmium. Diode nanowires can include multiple segments to create a Schottky barrier diode, such as a bi-segment nanowire diode (110) or a tri-segment nanowire diode (120), for example.

Figure 1B:
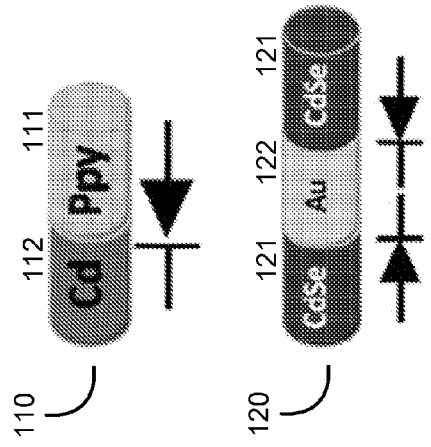
Figure 1C:
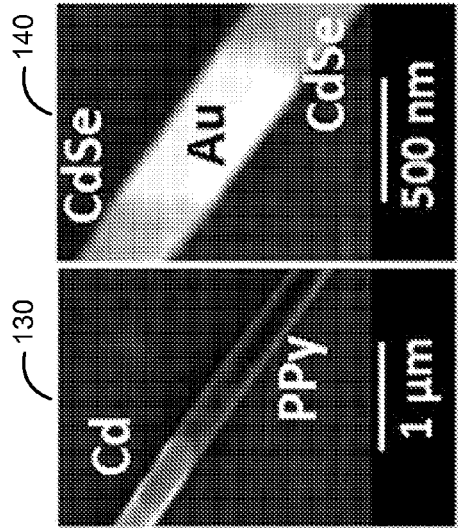

FIG. 1B shows an illustration of the bi-segment nanowire diode 110 that can be configured to include a polypyrrole (PPy) segment 111 and a cadmium (Cd) segment 112 to form a PPy-Cd Schottky barrier diode nanowire motor. FIG. 1B also shows an illustration of the tri-segment nanowire diode 120 can be configured to include a gold (Au) segment 122 between cadmium selenide (CdSe) segments 121 to form a CdSe—Au—CdSe Schottky barrier diode nanowire motor. FIG. 1C shows Scanning Electron Microscopy (SEM) images of an exemplary 200 nm diameter bi-segment PPy-Cd nanowire diode (130) and an exemplary 200 nm diameter tri-segment CdSe—Au—CdSe nanowire diode (140).

Methods to fabricate nanowire diodes for locomotion can include the following exemplary procedures.

Polypyrrole-cadmium nanodiodes can be prepared in the following manner. For example, a porous alumina membrane template containing 200-nm diameter cylindrical pores and thickness of 60 μm can be used, and the branched surface of the membrane can be initially sputtered with gold using a desktop sputtering machine (e.g., Denton Vacuum, Desk IV, Moorestown, N.J.) to serve as a working electrode. A sacrificial gold layer can be electrodeposited using a gold plating solution (e.g., Orotemp 24 RTU RACK; Technic Inc., Anaheim, Calif.), a total charge of 1.5 C and a potential of −0.9 V [vs. Ag/AgCl (3 M NaCl)], in connection with a Pt wire counter electrode. The polypyrrole and cadmium segments can be subsequently electrodeposited into a porous alumina membrane to prepare PPy-Cd nanodiodes. Polypyrrole can be deposited from a 0.5 M pyrrole solution containing 0.2 M tetraethylammonium tetrafluoroborate in acetonitrile. The polypyrrole deposition can involve a total charge of 0.5 C and a potential of +0.8 V (vs. a Ag/Ag$^+$/ACN non-aqueous reference electrode). The latter can include a silver wire that can be immersed in a solution containing 0.01M silver nitrate in acetonitrile (ACN). The cadmium segment can be deposited from an aqueous solution containing 0.3 M cadmium sulfate and 0.25 M sulfuric acid, using a potential of −0.8 V [vs. Ag/AgCl (3 M NaCl)] and a total charge of 3.5 C. Monocomponents polypyrrole, cadmium, gold and bicomponent PPy-Au nanowires (that can be used as controls) can be prepared under conditions similar to the individual segments of the diode nanowires.

Cadmium Selenide-Gold-Cadmium Selenide nanowires can be prepared by modifying the previously described method. For example, an Au sputtered film can be used along with a sacrificial Ag layer (3 C) electrodeposited into the branched area. The CdSe plating solution can be prepared from 0.3 M CdSO$_4$, 0.25 M H$_2$SO$_4$, and 0.7 mM SeO$_2$. Plating can use cyclic voltammetry by scanning the voltage 12000 times between −357 mV to −757 mV at a scan rate 750 mV/s (vs. Ag/AgCl reference electrode). A gold segment can be deposited on top of CdSe (at −0.9V and a charge of 1.5 C) followed by another CdSe segment. In order to obtain free standing nanowires, the sputtered gold film and the sacrificial silver layer can be simultaneously removed by mechanical polishing using a cotton tip soaked with 35% HNO$_3$. The membrane can then be dissolved in a 3 M NaOH solution for 30 min to completely release the nanowires. The nanowires can be collected by centrifugation at 6000 rpm for 10 min and can be washed repeatedly with nanopure water (18.2 MΩ.cm) until a neutral pH is achieved. Nanowire solutions can be stored in nanopure water at room temperature, and their speed can be evaluated on the same day of synthesis.

Polystyrene particles (2.0 μm), which were used during exemplary control experiments, can be purchased from Polysciences (Warrington, Pa.). Polystyrene particles (2.0 μm) can be washed by centrifugation at 10,000 rpm for 10 min with water to remove the excess of surfactant.

Scanning electron microscopy (SEM) images can be obtained with Phillips XL30 ESEM instrument using an acceleration potential of 10 kV. The metal composition can also be studied by energy dispersive X-ray analysis (EDAX) coupled with the Phillips XL30 ESEM instrument.

Figure 2A:
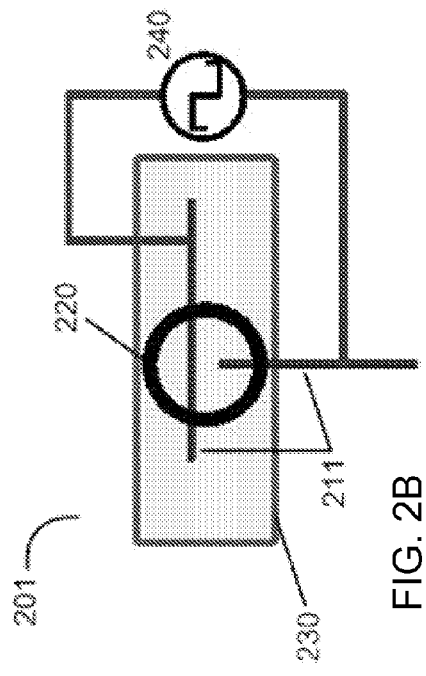
FIGS. 2A and 2B show systems for propelling fuel-free nanowire diodes using electric fields.

The motion of the synthesized nanowire diodes can be examined and implemented by applying an external alternating electric field at varying frequencies and potentials. FIG. 2A shows an exemplary system 200 for studying propulsion of fuel-free nanowire diodes using a spatially uniform AC electric field. System 200 can include two gold wires 210 (e.g., of 200 μm diameter and separated from each other by 2 mm) configured parallel to each other upon the surface of a microscope cover slide 230. An epoxy well embedded with a Viton® O-ring 220 can be prepared on the microscope cover slide 230 to contain a fluid. A function generator 240, e.g., Agilent 33120A Function/Arbitrary Waveform Generator, can be used as the excitation source to generate a square wave encompassing a 50% duty cycle. Any exemplary experiments can be carried out at an external voltage, for example, of 50 V cm$^{-1}$, and square-wave frequency of 18 Hz, which can produce a spatially uniform AC electric field to locomote nanowire diodes without chemical reactions with materials of the nanowire diodes.

Figure 2B:
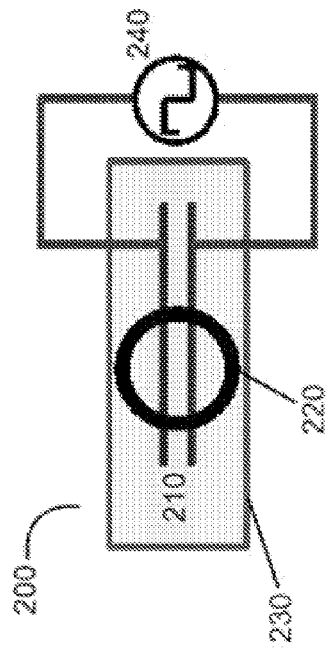

FIG. 2B shows an exemplary system 201 for studying propulsion of fuel-free nanowire diodes using a spatially non-uniform AC electric field. System 201 can include two gold wires 211 (e.g., of 200 μm diameter and separated from each other by 2 mm) configured perpendicular to each other upon the surface of a microscope cover slide, e.g., cover slide 230. An epoxy well embedded with a Viton® O-ring, such as epoxy well 220, can be prepared on the microscope cover slide 230 to contain a fluid. The function generator 240 can be used as the excitation source to generate a square wave encompassing a 50% duty cycle. Any exemplary experiments can be carried out at an external voltage, for example, of 50 V cm$^{-1}$, and square-wave frequency of 18 Hz to generate a non-uniform AC electric field. Nanowire diode motion can be examined using both spatially uniform (e.g., FIG. 2A) and non-uniform (e.g., FIG. 2B) electric fields, depending on the configuration of the gold electrodes.

Tracking of diode nanomotors can be performed. For example, a system for tracking diode nanomotors can include an imaging device, such as an inverted optical microscope (e.g., Nikon Instrument Inc. Ti—S/L100), which can be equipped with a 40× objective and a Photometrics QuantEM 512/SC camera (Roper Scientific, Duluth, Ga.). The system for tracking diode nanomotors can include modules for data processing, data storage and data transfer, including software for capturing and analyzing video and still images, e.g., MetaMorph 7.6 software (Molecular Devices, Sunnyvale, Calif., USA), which can be used for capturing video clips at a rate, for example, of 30 frames per second. The depth of the field can be very small (~2 μm). Thus, in some instances only the nanodiodes closer to the solution/air interface can be brought into the focal plane. The nanomotor movement can be tracked using a Metamorph tracking module and the results can be analyzed using OriginLab software.

Figures 3A, 3B, 3C, 3D, 3E:
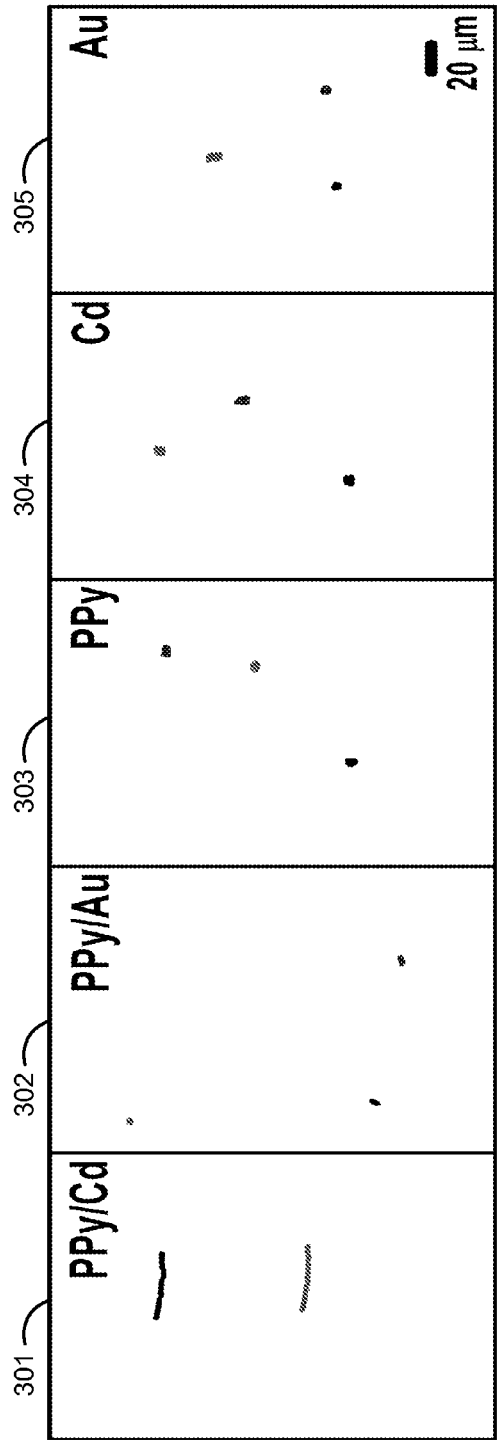
FIGS. 3A, 3B, 3C, 3D, and 3E show track lines illustrating distances traveled by exemplary nanowires under a uniform electric field.

FIGS. 3A-3E show exemplary results of motion trajectories of template-grown diode nanowires, bicomponent nanowires, and monocomponent nanowires over a 3 sec period, taken from videos of the nanowires under the application of a spatially uniform AC square-wave electric field. The exemplary results were obtained by employing the exemplary system 200 in FIG. 2A, where the distance between electrodes (e.g., parallel gold wires 210) was 0.2 cm. The spatially uniform square-wave AC electric field had a frequency of 18 Hz and a field amplitude of 50 V/cm. FIG. 3A shows track lines 301 of PPy-Cd diode nanowires; FIG. 3B shows track lines 302 of bicomponent PPy-Au nanowires; FIG. 3C shows track lines 303 of monocomponent PPy nanowires; FIG. 3D shows track lines 304 of Cd nanowires; and FIG. 3E shows track lines 305 of Au nanowires. From these exemplary results, PPy-Cd diode nanowires exhibited defined locomotion over a dramatically long path (as seen in FIG. 3A) that can be due to the half-wave voltage induced through each diode as a result of the rectification of the applied AC electric field. The motion shown is parallel to the field axis, supporting that such movement is not of induced-charge electrophoresis origin (as motion due to induced-charge electrophoresis is expected to be perpendicular to the field direction). The speed of these exemplary PPy-Cd nanowire diodes was measured at about 17.2 μm/sec, which is approximately 7 body-lengths/sec. The observed locomotion can be attributed to the appearance of an electro-osmotic flow that propels the diodes.

In comparison with motion trajectories in FIGS. 3B-3E, a negligible (primarily oscillatory) motion was observed for the control experiments involving the monocomponent polymeric (FIG. 3C) or metal nanowires (FIG. 3D-3E) over the same time period. Speeds of 1.8, 1.7, and 1.4 μm/sec were estimated for the Cd, PPy and Au nanowires, respectively. FIG. 3B suggests that negligible motion (at a speed of 1.8 μm/sec) was exhibited for the bi-segment PPy-Au nanowire which formed an ohmic junction. The obtained results indicate that an electro-osmotic flow is generated and propels diode nanowires, but the bi-segment nanowires do not exhibit such motion under the same external AC electrical field. Overall, the traces shown in FIGS. 3A-3E illustrate the directed propulsion of the electrically-driven nanowire diodes compared to that of the control monocomponent and bicomponent nanowires, indicating that the motion can be driven by a local electro-osmotic flux powered by the external field.

Additional exemplary control experiments were performed with polystyrene particles of about 2 μm in diameter. Both the nanodiodes and polystyrene particles were exposed to the same uniform and non-uniform AC electric fields (e.g., see experimental setups in FIGS. 2A and 2B). The results of these experiments can further demonstrate the distinction between dielectrophoretic-driven motion and field-induced electro-osmotic propulsion. For polystyrene particles, the interaction of the dipoles induced by the applied non-uniform electric field lead to a self-dielectrophoretic (DEP) force, which in turn, enables their motion. Under the uniform electric field, however, the force acting on each of the poles of the induced dipole within the particles are equal in magnitude and opposite in direction and thus should not generate net particle motion.

Figures 4A, 4B, 4C, 4D:
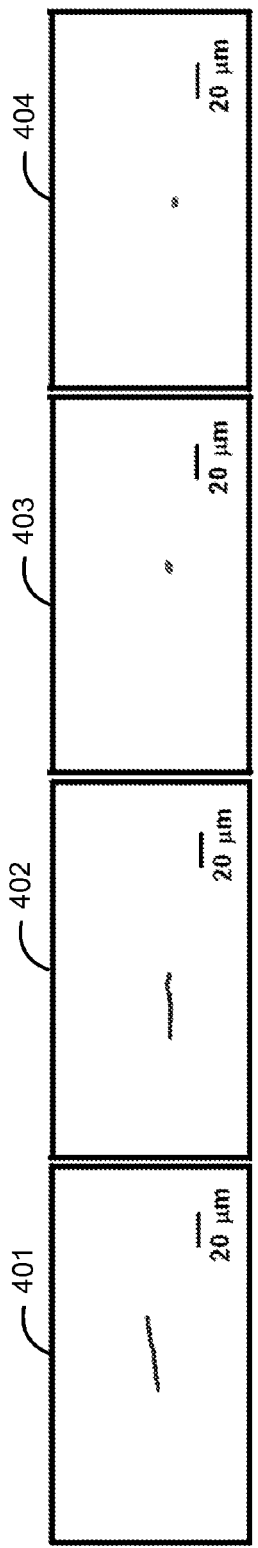
FIGS. 4A, 4B, 4C, and 4D show track lines illustrating distances traveled by PPy-Cd nanowires, CdSe—Au—CdSe nanowires, and PS spheres under a uniform electric field.

FIGS. 4A-4D show exemplary results that display track lines of exemplary PPy-Cd nanowires, CdSe-Au-CdSe nanowires, and polystyrene (PS) spheres. FIG. 4A shows track line 401 of PPy-Cd nanowires under a spatially uniform AC electric field. FIG. 4B shows track line 402 generated by CdSe—Au—CdSe nanowires under a spatially uniform AC electric field. FIGS. 4C and 4D show track lines 403 and 404, respectively, generated by PS spheres under the same spatially uniform AC electric field as in FIGS. 4A and 4B. The exemplary experiment used the same experimental conditions as those described for FIGS. 3A-3E. In the uniform electric field, both PPy-Cd diode nanowires and CdSe—Au—CdSe diode nanowires display directed movement that can be due to the rectified field-induced electro-osmotic flow, which was exemplified by track line 401 in FIG. 4A and track line 402 in FIG. 4B. In contrast, the polystyrene particles can exhibit only an oscillatory motion with no apparent directional motion, which was exemplified by track lines 403 and 404 in FIG. 4C and FIG. 4D, respectively. When a non-uniform electric field is applied, both diode nanowires and polystyrene spheres can exhibit directed motion, with the net electrostatic (DEP) force causing the particle motion. Overall, FIGS. 4A and 4B can exemplify that the nanodiode movement resulted from a local electro-osmotic flux powered by the external field, and not by dielectrophoretic-driven motion.

Figure 5:
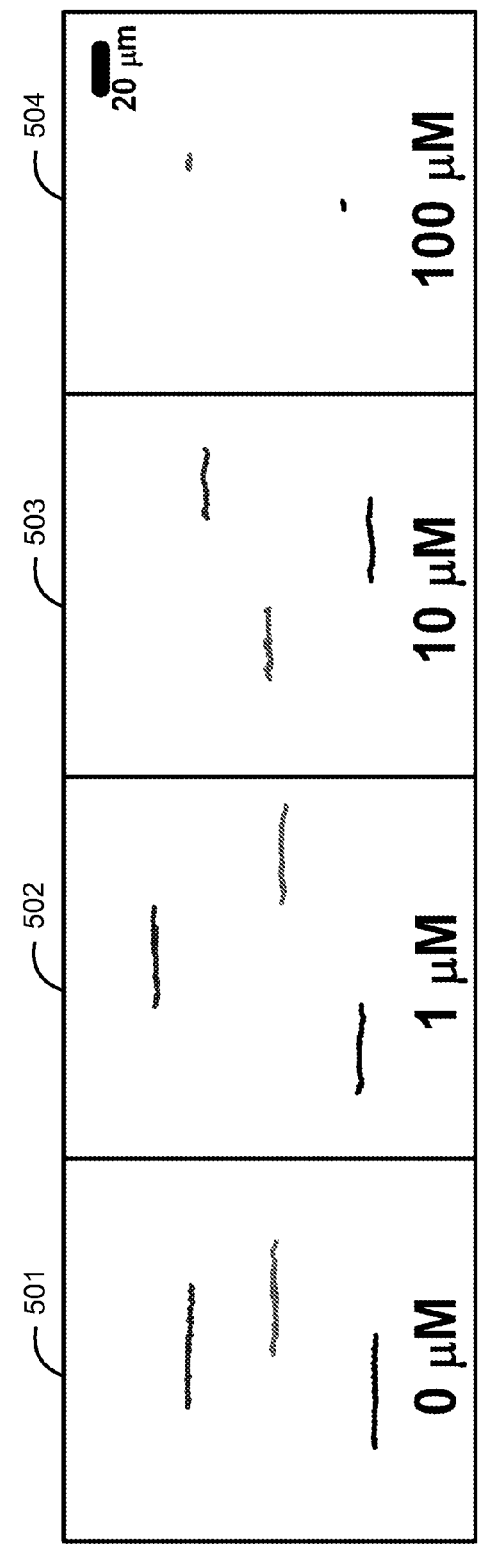
FIG. 5 shows track lines of nanodiodes in different concentrations of NaCl solution under a uniform electric field.

FIG. 5 shows exemplary results of the effect of electrolyte concentration (e.g., NaCl) upon the motion of PPy-Cd nanodiodes under a uniform AC electric field. The resulting track lines 501, 502, 503, and 504 of the PPy-Cd nanodiodes corresponding to different concentrations of NaCl solution (e.g., 0, 1, 10, and 100 μM NaCl, respectively, as shown in FIG. 5) illustrate the distances traveled by PPy-Cd nanodiodes over a 3 sec period. The applied square-wave AC uniform electric field had an amplitude of 10 V with a frequency of 18 Hz implemented using the exemplary system 200. While a directed motion is observed at the different salt concentrations, the speed decreased gradually (e.g., from 21 to 4 μm/sec upon raising the ionic strength between 0 and 100 μM). Such changes can exemplify that although electro-osmosis is indeed the driving force of the motion, the addition of free charge carriers can influence the displacement of the ions in the vicinity of the nanodiodes, thereby contributing to reduced locomotion.

Examples provided here demonstrate controlled propulsion of diode nanowires under an electrical field, e.g., a spatially uniform AC electric field. Exemplary fabrication methods, such as membrane template growth route, can be used for preparing compositionally tailored diode nanowires, such as electrically-driven nanodiode artificial "swimmers" formed by multi-segment PPy-Cd and CdSe—Au—CdSe nanowires. Fuel-free nanostructure motors may be formed from nanowires made of other semiconductor diode configurations. Implementations of the disclosed fuel-free nanowire motors with electrically-driven locomotion can be applied to a wide range of biomedical applications, e.g., targeted drug delivery and microsurgery applications. Additionally, the disclosed technology can include multi-segment nanowire motors that can be spatially functionalized towards the creation of nanomachines performing practical tasks.

In another embodiment of the disclosed technology, fuel-free nanomotor locomotion in a fluid can be implemented by flexible nanowires that can be propelled by a magnetic field, which can efficiently convert magnetic energy into mechanical locomotion. A magnetically-driven nanomotor can include a multi-segmented flexible nanowire motor formed of two or more different materials. A magnetic material can constitute an end segment (e.g., the 'tail' segment), which can include magnetic metals, ceramics, polymers, and composites, such as iron, iron oxide, nickel, cobalt, gadolinium, alloyed rare earth metals, and other magnetic compounds. The multi-segmented flexible nanowire motor can include a flexible segment, which can constitute an end-segment or a central segment. The flexible segment can include materials in which controlled mechanical deformation can be enabled, for example by the motion of the (magnetic) end segment undergoing movement induced by an external magnetic field. An external magnetic field can include a rotational magnetic field, which can induce rotational motion of the magnetic end segment coupled to the flexible segment in the flexible nanowire motor. The rotational motion of the magnetic end segment can result in controlled mechanical elastic deformation of the flexible segment that breaks the system symmetry of the flexible nanowire motor, which undergoes movement in the fluid.

In one example, a multi-segmented metal nanowire can include a Au—Ag—Ni nanowire that has a gold 'head' and nickel 'tail' that are linked by a flexible interconnect structure, e.g., a partially dissolved and weakened silver bridge. The flexible bridge is structured to facilitate the cyclic mechanical deformations under external rotating magnetic field. Under an external rotating magnetic field the exemplary nickel segment can start to rotate, facilitating the rotation of the gold segment at a different amplitude, hence breaking the system symmetry and inducing the movement. Forward ('pushing') and backward ('pulling') magnetically-powered locomotion and a precise On/Off motion control can be achieved by tailoring the length of the nickel and gold segments and modulating the magnetic field, respectively. The fuel-free magnetic nanowire "swimmers" can be prepared in large scale using a simple template electrodeposition protocol and offer considerable promise for diverse practical applications. For example, fuel-free magnetic nanowire swimmers can be configured for efficient locomotion in urine samples and in high-salt media.

Magnetically-driven motion can represent an attractive modality for nanoscale propulsion and fuel-free locomotion. Magnetically-driven nanoscale propulsion can be associated with the breaking of the system symmetry by deforming the motor shape, e.g., magnetic force can be used to provide the mechanical deformation essential for breaking the symmetry. The described technology can include fuel-free flexible metal nanowire swimmers by magnetically-driven propulsion, which can offer at least one approach for addressing some constraints in nanoscale locomotion within many applications.

Figure 6A:
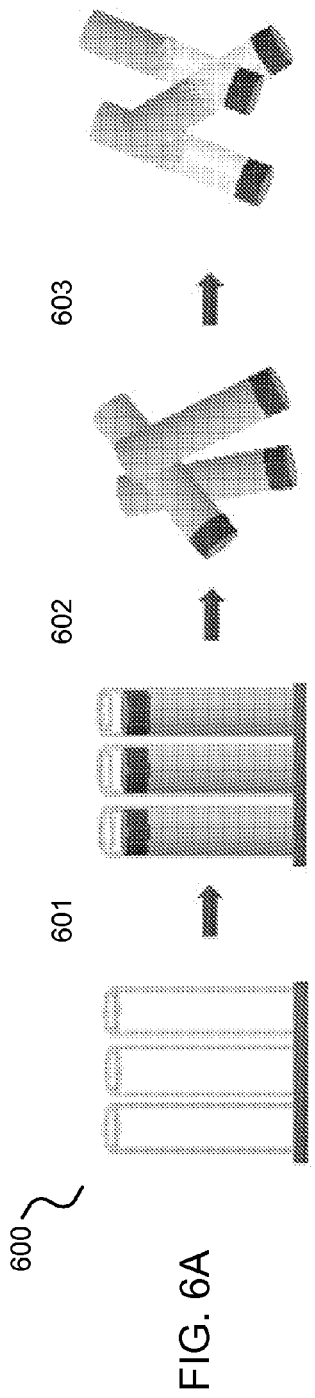
FIGS. 6A and 6B show exemplary preparation and propulsion illustrations of fuel-free nanowire motors using magnetic fields.

FIG. 6A shows an exemplary process 600 to prepare multi-segment nanowire motors using a template electrodeposition approach. The process 600 shown in FIG. 6A exemplifies electrochemical preparation of a 3-segment nanomotor comprising Au, Ag, and Ni that can be configured to be, for example, approximately 6 μm long and 200 nm in diameter. Process 600 can include process 601 for performing sequential template deposition of gold, silver and nickel segments into alumina membrane micropore template. In some cases, a silver layer can be sputtered over the alumina membrane micropore template. Process 600 can include process 602 for performing removal of the sputtered silver layer and dissolution of the alumina template in, for example, 3 M NaOH to release the nanowires. Process 600 can include process 603 for performing partial dissolution of the silver segment in hydrogen peroxide (e.g., a 8% $H_2O_2$ solution for one min) to create the flexible thinner joint (linking the Au 'head' and Ni 'tail') for controlled mechanical deformation of the nanowires. Exemplary experimental data has shown rapid and yet incomplete dissolution of the central Ag segment and formation of a flexible joint within 10-15 sec in the peroxide solution. The described electrochemical preparation (e.g., process 600) of metal nanowires can greatly simplify the preparation of magnetic nanowire swimmers, as compared to fabrication of cork-screw or helical magnetic propellers for example. The resulting fuel-free flexible nanowire swimmers can offer great promise for diverse biomedical applications.

Figure 6B:
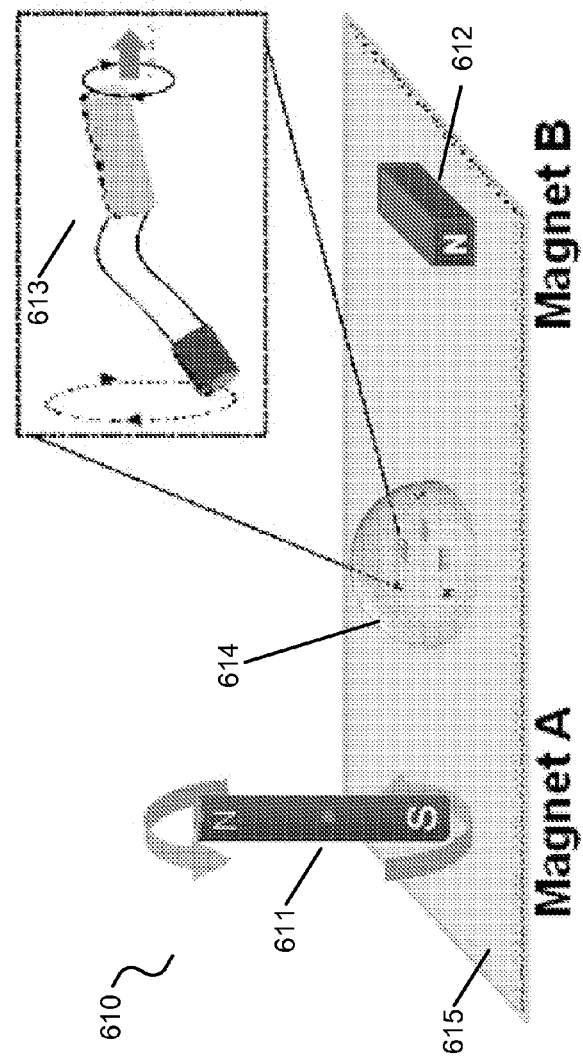

FIG. 6B shows an illustration of an exemplary system 610 for propulsion of magnetic nanowires with a flexible Ag segment in a fluid under an external rotating magnetic field. The external magnetic field can be provided by a rotating magnet 611 (Magnet A) and static magnetic 612 (Magnet B). The exemplary system 610 can be configured to eliminate whole body rotation (in the perpendicular direction) by, for example, the static magnetic 612 being configured to compensate the rotation torque. This configuration can make the nanowire (e.g., nanowire 613) become stable and generate a cone-shaped rotation of the Ni segment (as shown in the expanded view box of FIG. 6B), which can break the symmetry and facilitate movement along the nanowire axis within a fluid (e.g., fluid 614) contained in a container (615).

Methods to fabricate magnetically-driven nanowire motors for fuel-free locomotion can include the following exemplary procedures.

Exemplary gold/silver/nickel magnetic nanowires can be prepared using a template-directed electrodeposition protocol, such as process 600 shown in FIG. 6A. A silver film can be first sputtered on one side of an exemplary porous alumina membrane template having 200 nm diameter cylindrical pores and 25 mm diameter to serve as a working electrode. The membrane can then be assembled in a plating cell with an aluminum foil serving as a contact for the sputtered silver. Copper can be electrodeposited in the branch area from a 1 M $CuSO_4.5H_2O$ solution, for example using a charge of 8 C and a potential of −0.9 V (vs. Ag/AgCl reference), along with a Pt-wire counter electrode. Subsequently, gold can be plated from a gold-plating solution (e.g., Orotemp 24 RTU RACK; Technic Inc.) at −1.0 V (vs. Ag/AgCl), for example using a charge of 4 C or 3 C (for 'forward' or 'backward' motions, respectively); silver can be plated at −0.9 V (vs. Ag/AgCl) for a total charge of 3 C (for 'forward') or 3.5 C (for 'backward') using a silver plating solution (e.g., 1025 RTU @ 4.5 Troy/gallon; Technic Inc., Anaheim, Calif.); and finally Ni can be plated from a nickel plating solution containing 20 g/L $NiCl_2.6H_2O$, 515 g/L $Ni(H_2NSO_3)_2.4H_2O$, and 20 g/L $H_3BO_3$ at −1.0 V (vs. Ag/AgCl) for 2 C (for 'forward') or 3 C (for 'backward'). The sputtered silver layer and copper sacrificial layer can be mechanically removed from the membrane by polishing with 3-4 μm alumina slurry using a grinder/polisher (e.g., model 900, South Bay Technology Inc., San Clemente, Calif.). The membrane can then be dissolved in a 3 M NaOH solution for 30 min to completely release the nanowires. The nanowires can be collected by centrifugation at 6000 rpm for 5 min and can be washed repeatedly with nanopure water (18.2 MΩ.cm) until a neutral pH is achieved. Nanowire solutions can be stored in nanopure water at room temperature. The flexible thinner joint of central silver segment can be prepared by its partial dissolution accomplished by mixing 10 μL of diluted Au—Ag—Ni nanowire solution with 10 μL of a 16% hydrogen peroxide solution for 1 min. The nanowires can then be washed under optical microscope using nanopure water (18.2 MΩ.cm) until a neutral pH is achieved. The preparation yield of backward moving wires can be higher compared to the forward moving ones. The nanowire sample can be used for SEM imaging of the partially dissolved Ag segment, in connection to a 1 min immersion in hydrogen peroxide on the glass slide, followed by immediate wash with nanopure water on the glass slide, and then dried. For imaging clarity and avoiding magnetic aggregation, the Ni segment can be replaced with an Au one.

Exemplary movement studies of the fuel-free magnetically-propelled nanowire motors can be performed by using alternating magnetic field with 5 Gauss Magnetic Induction, which can be provided by a rotating magnet (e.g., rotating magnet 611 (Magnet A): Cole-Parmer magnetic stirrer EW-84000-00) at a specific speed (0~15 Hz) and static magnet (e.g., and static magnetic 612 (Magnet B)). The static magnet can stabilize the nanowire swimmer by eliminating the whole body rotation (in the perpendicular direction). The magnetic induction can be measured by a Gaussmeter (e.g., Lake Shore Model 475 DSP Gaussmeter). Exemplary positions of the magnets are shown in the exemplary system 610 (FIG. 6B). Exemplary implementations of the locomotion of nanowire swimmers in high salt and urine samples (e.g., collected from a healthy volunteer) can be carried out by mixing directly with the nanomotor solution (1:1 mixing). Note that, due to electrostatic effects, some of the nanowires can adhere during high-salt experiment.

Electrochemical deposition of nanowires can be carried out with a CHI 621A potentiostat (CH Instruments, Austin, Tex.). Scanning electron microscopy (SEM) images can be obtained with Phillips XL30 ESEM instrument using an acceleration potential of 20 kV. Tracking of magnetically-driven nanowire motors can be performed. For example, a system for tracking nanowire motors can include an imaging device, such as an inverted optical microscope (e.g., Nikon Instrument Inc. Ti—S/L100), which can be equipped with a 40× objective and a Photometrics QuantEM 512/SC camera (Roper Scientific, Duluth, Ga.). The system for tracking nanowire motors can include modules for data processing, data storage and data transfer, including software for capturing and analyzing video and still images, e.g., Meta-Morph 7.6 software (Molecular Devices, Sunnyvale, Calif., USA), which can be used for capturing video clips at a rate, for example, of 30 frames per second. The speed of the nanomotors can be tracked using a Metamorph tracking module and the results can be statistically analyzed using Origin software.

To illustrate the role of the nanowire flexibility in achieving the magnetic propulsion, the motion of the exemplary Au—Ag—Ni nanowires can be compared before and after the partial silver dissolution. Also, the role of segment lengths at the 'head' and 'tail' ends in achieving 'forward' and 'backward' movement can be compared. FIGS. 7A, 7B, 7C, and 7D show a comparison of 'forward' (FIGS. 7A and 7B) and 'backward' (FIGS. 7C and 7D) movement of rigid Au—Ag—Ni nanowires (panel (a) in FIGS. 7A and 7C) and flexible Au—$Ag_{flex}$—Ni nanowires (panel (b) FIGS. 7A and 7C) under an external rotational magnetic field.

The external rotational magnetic field implemented in the exemplary results of FIGS. 7A and 7C was set to 5 Gauss, at f=15 Hz in FIG. 7A and f=10 Hz in FIG. 7C, over a 15 s period. The lengths of the exemplary Au, Ag and Ni segments featured in FIG. 7A are 3 µm, 3 µm, and 0.5 µm, respectively; the lengths of the exemplary Au, Ag and Ni segments featured in FIG. 7C are 2 µm, 3.5 µm, and 1 µm, respectively. FIGS. 7B and 7D show a schematic of the fuel-free magnetic nanowire swimmer moving 'forward' (FIG. 7B) and 'backward' (FIG. 7D).

FIG. 7A displays the motion trajectories of non-flexible Au—Ag—Ni nanowires as shown by track line 701 in panel (a) and flexible Au—$Ag_{flex}$—Ni nanowires as shown by track line 702 in panel (b). The exemplary motion trajectories in FIG. 7A were taken from videos of the nanowires under the rotating magnetic field over a 15 sec period. The flexible nanowires exhibit defined locomotion over a dramatically long path parallel to the magnetic field axis as shown by panel (b) in FIG. 7A, with a cone-shaped rotation of the Ni 'tail'. In this example, the speed of the flexible nanomotors was ~3 µm/s, e.g., approximately 0.5 body-length $s^{-1}$. In contrast, no directed motion was observed for the exemplary non-flexible (control) nanomotors that involved rigid Au—Ag—Ni nanowires over the same time period (FIG. 7A panel (a)).

To actuate the locomotion in a nonreciprocal fashion at a low Reynolds number, magnetic nanowire artificial swimming devices can deform their shape. The observed locomotion of the nanowire swimmer can be attributed to the transfer of the magnetic energy into cyclic mechanical deformations. The flexible Ag bridge can be essential for generating such cyclic mechanical deformations under an external rotational magnetic field such as the field illustrated in FIG. 6B. The rotation of the Ni 'tail' can resemble the rotation mechanism of microorganisms. Similar to natural microorganisms, the disclosed technology can include artificial nanowire swimmers that can have a body and a propulsive appendage, deforming in a continuous fashion. The rotating magnetic field can create a cone shaped rotation of the Ni segment which can cause rotation of the Au segment on the opposite end. Such rotation of Au and Ni segments with different amplitudes and phase difference, due to bending of the Ag joint, can break the system symmetry to induce the movement.

FIG. 7B illustrates the mechanism of locomotion of an exemplary flexible fuel-free Au—$Ag_{flex}$—Ni nanowire motor (710). The nanowire motor 710 can include a Ni wire 'tail' (711), a Ag wire 'joint' (712), and a Au wire 'head' (713). Propulsion can be achieved when the flexibility of the connecting thin Ag wire segment (712) allows for bending, so that the shorter Ni wire segment (711)—which has a larger amplitude—is tilted backwards relative to the cone surface. Thus, when rotated, this section can produce a force away from centroid of the nanowire motor 710. The flexibility of the central Ag bridge 712 can facilitate generation of rotation of the Ni segment 711 around the nanowire axis under the magnetic field, like that shown in FIG. 6B, e.g., by coupling rotating magnet 611 (Magnet A) and static magnet 612 (Magnet B). The magnetic field can generate torques which can lead to the rotation of the entire nanowire along its axis, resulting in breaking of the symmetry which induces the movement.

Tailoring the length of the Au 'head' and Ni 'tail' can change the asymmetry geometry and allows reversal of the motion direction. Different rotation amplitudes can thus be generated on both sides of a fuel-free Au—Ag—Ni nanowire motor, which can lead to forward ('pusher') or backward ('puller') locomotion. FIG. 7B shows an exemplary forward ('pusher') Au-$Ag_{flex}$—Ni nanowire motor. FIG. 7D shows an exemplary backward ('puller') Au—$Ag_{flex}$—Ni nanowire motor.

For example, flexible nanowires with a longer Au segment (e.g., 3 µm) and a shorter Ni segment (e.g., 0.5 µm) can move 'forward' in the rotating magnetic field, as seen in FIG. 7A panel (b). Under this condition, the exemplary flexible fuel-free nanowire can resemble a 'pusher' since the rotation amplitude (R1) of the Ni segment 711 is much larger than the rotational amplitude (R2) of the Au segment 713, e.g., R1>>R2, as seen in FIG. 7B. Here, the rotation of the Ni segment can induce a flow field directed away from the nanowire along its swimming direction. A shorter configured 'tail' can be associated with a larger conical angle as compared to the 'head' (e.g., the nickel segment 711 as seen in FIG. 7B as compared to the gold segment 713). Nanowire motors configured with a shorter 'tail' can be associated with a larger conical angle, and hence a larger average force in the direction of the 'head' (as the force and speed are directly proportional to the projection of the area in the direction of motion). The speed can also be proportional to the length of the segment. Another factor that can affect the motion is fluid flow, which can be moving at a higher speed relative to the nanowire swimmer on the lagging section.

In another example, flexible nanowires can be configured to locomote with 'backward' movement (e.g., with the Ni tail upfront) by creating a shorter Au segment (e.g., 2 µm) and a longer Ni segment (e.g., 1 µm). FIG. 7D illustrates the mechanism of locomotion for this condition, in which an exemplary flexible fuel-free Au—$Ag_{flex}$—Ni nanowire motor (720) can include a Ni wire 'tail' (721), a Ag wire 'joint' (722), and a Au wire 'head' (723). The Ni segment 721 can be configured to be larger, e.g., than the Ni segment 711 (previously shown in FIG. 7B), and the Au segment 723 can be configured to be smaller, e.g., than the Au segment 713 (previously shown in FIG. 7B). FIG. 7C displays the 'backward' motion trajectories of non-flexible Au—Ag—Ni nanowires as shown by track line 703 (in panel (a)) and flexible Au-$Ag_{flex}$-Ni nanowires as shown by track line 704 (in panel (b)). Configuring flexible nanowires for such directed 'backward' movement can result in nanowire speeds of ~4 µm/s (seen in FIG. 7C panel (b)). Analogous (control) experimental implementations of nonflexible nanowires without dissolving the Ag segment displayed no directed movement (seen in FIG. 7C panel (a)). Additional data indicate that the 'backward' motion of the 'puller' flexible nanowires can be more efficient and can offer significantly higher reproducibility, along with improved motion control, as compared to the 'forward' movement of the 'pusher' flexible nanowires. This can be considered unsurprising, as a pulling motion of slender bodies in a resistant medium can be more stable than a pushing one (e.g., analogous to pushing a string on a frictional surface, as opposed to pulling it). Accordingly, such 'backward' motion was used in most of the subsequent examples described herein. Certain lengths of the 'tail' and 'head' (e.g., around 0.7 and 2.5 μm, respectively) can represent the cross-over values where both 'forward' and 'backward' motions can be observed randomly.

Figures 8A, 8B:
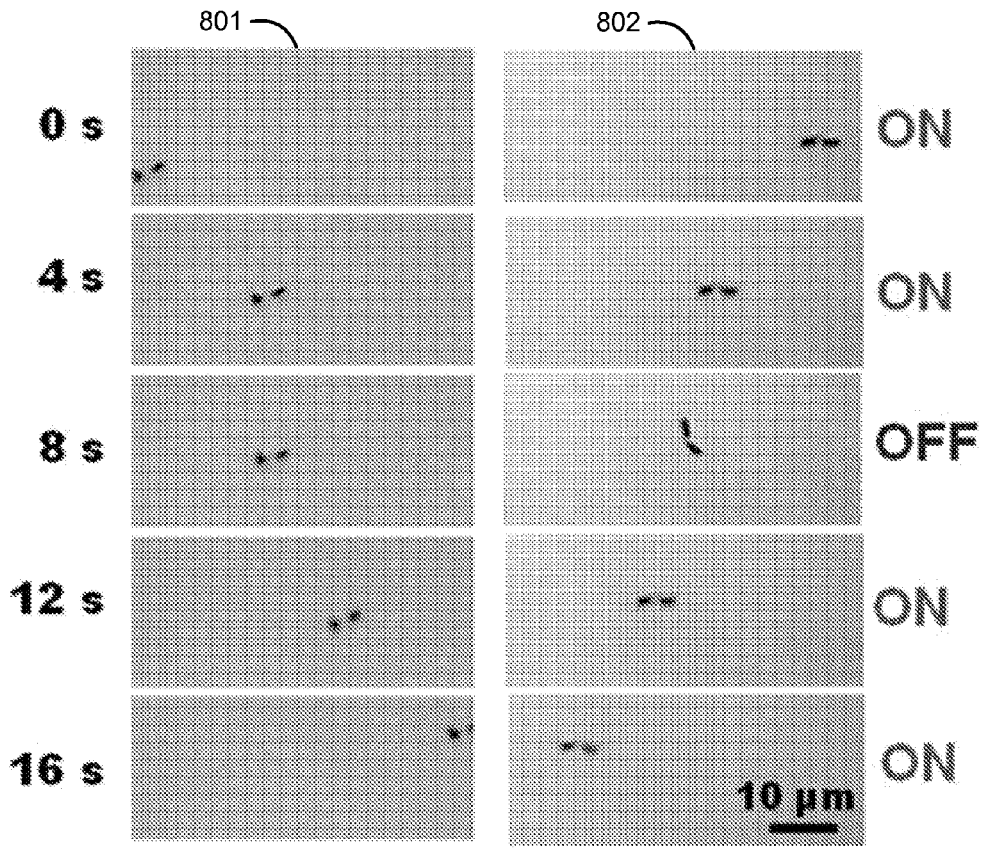
FIGS. 8A and 8B show time-lapse images illustrating On/Off/On 'forward' and 'backward' motions of Au—$Ag_{flex}$—Ni nanomotors under a rotating magnetic field.

Modulating the magnetic field can allow for precise On/Off motion control of the flexible nanowire motors. The magnetic nanowire motor can stop and resume its motion reversibly upon turning the magnetic field Off and On, respectively. FIG. 8A shows exemplary time-lapse images 801 illustrating the On/Off/On cycle of Au—$Ag_{flex}$—Ni nanomotors under a modulated, rotating magnetic field in 'forward' motion. Conditions were similar to those described in FIGS. 7A and 7C. The images were taken every 4 s from a video. FIG. 8B shows exemplary time-lapse images 802 illustrating the On/Off/On cycle of Au—$Ag_{flex}$—Ni nanomotors under a modulated, rotating magnetic field in 'backward' motion. These data can clearly illustrate that the directional movement of these nanomotors can be stopped in the absence of the magnetic field (e.g., as seen at 8 s in FIGS. 8A and 8B) and can be renewed upon switching the field 'On' (e.g., as seen after 8 s in FIGS. 8A and 8B). It can be noted that an initial rotation of the Ni 'tail' is important for resuming the motion. Such precise motion control, along with other capabilities (that are described below), can hold great promise for designing functional devices that perform multiple tasks.

Figure 9:
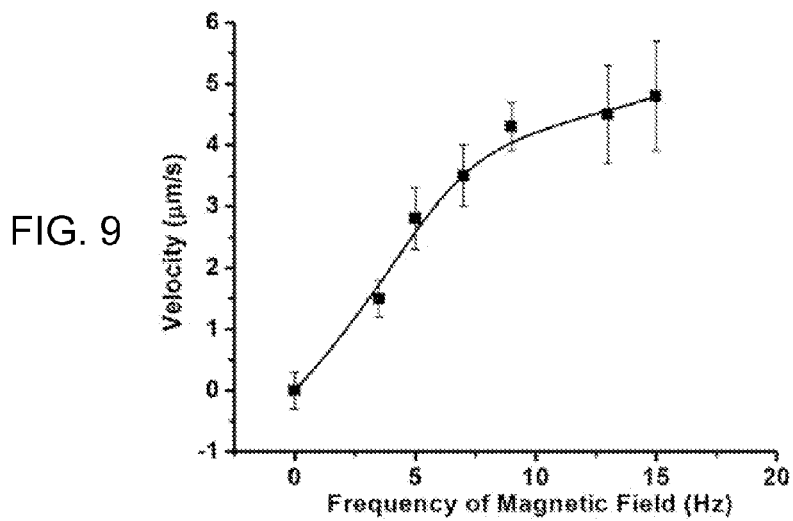
FIG. 9 shows a plot of speed of a 'backward' moving nanomotor over a frequency range of a rotational magnetic field.

Various tests were conducted, and the test results suggest that these magnetic nanowire swimmers can display predictable and controllable behavior in the linear regime. For example, the nanomotor speed can be controlled by varying the frequency of the applied field. FIG. 9 shows a plot demonstrating the relationship of nanomotor speed with the frequency of a rotating magnetic field (over the 0-15 Hz range). In this example, 'backward' moving nanomotors were configured with Au, Ag and Ni segments lengths of 2 μm, 3.5 μm, and 1 μm, respectively, and the rotating magnetic field was configured at B=5 Gauss over a frequency range f=0-15 Hz. As seen in FIG. 9, the nanomotor speed can increase from 1.5 to 6 μm/s upon raising the frequency between 5 to 15 Hz. When no magnetic field was applied, only Brownian motion was observed.

FIGS. 10A and 10B show backscattered SEM images of nanowire swimmers. FIG. 10A shows an exemplary nanowire swimmer configured to move 'forward' before dissolving the silver segment. FIG. 10B shows an exemplary nanowire swimmer configured to move 'backward' before dissolving the silver segment. FIG. 11 shows an SEM image of an exemplary flexible Au—Ag—Ni nanowire featuring central Ag segment 1101 following one minute immersion in an 8% $H_2O_2$ solution for its dissolution. The view box shows a magnified image of Ag segment 1101.

Catalytic nanowire motors that consume a fuel for movement only operate in low ionic-strength aqueous solutions, and hence cannot be applied in realistic biological environments. The described technology can include magnetic nanowire swimmers that can overcome this ionic-strength limitation and can expand the scope of artificial nanomotors to salt-rich environments. FIGS. 12A-12C shows track lines that comparatively demonstrate the movement of exemplary flexible nanowires in the absence of salt (FIG. 12A) and in 30 μM KCl (FIG. 12B) and in 30 mM KCl (FIG. 12C) solutions, respectively. Track line 1201 shows the nanowire swimmer movement in pure water; track line 1202 shows the nanowire swimmer movement in 30 μM KCl solution; and track line 1203 shows the nanowire swimmer movement in 30 mM KCl solution. The 10 μm scale bar in FIG. 12C is applicable to FIGS. 12A and 12B, as well. Conditions of this exemplary demonstration involved a 5 Gauss rotating magnetic field with a 10 Hz frequency; track lines reflect these conditions over a 15 sec period. These data in FIGS. 12A-12C indicate that the high ionic-strength medium has a minimal effect upon the movement of the magnetic nanowire swimmers. Also, no speed change in the different salt environments was observed. The exemplary fuel-free flexible magnetic nanowire swimmers can move with favorable locomotion in salt-rich environments, which can have important implications upon future applications of artificial nanomotors. For example, FIG. 13 displays time-lapse images of the movement of magnetic nanowire swimmer in an undiluted urine sample. The exemplary flexible nanowire motor displays an efficient locomotion over a defined path in this biological medium. FIG. 13 shows time-lapse images 1301 of the 'backward' motion of exemplary Au—$Ag_{flex}$—Ni nanomotors in a urine sample under the rotating magnetic field under conditions similar to those described in FIG. 7C.

The disclosed technology can demonstrate propulsion of fuel-free flexible magnetic nanowire swimmers under an external magnetic field. Such magnetically-driven nanowire locomotion can obviate the fuel requirement of catalytic nanowire motors and can resemble microorganisms that use rotation mechanism for their motion. The disclosed design can also obviate the use of helical (cork-screw) microstructures. The magnetic propulsion of the exemplary nanowires can involve the flexibility of a joint segment, e.g., silver or a polymer, that can be created by partial dissolution, e.g., in hydrogen peroxide. The exemplary flexible nanowire motors can be made of metallic nanowires (with three segments of Au, Ag and Ni) that can 'swim' at fast speeds, e.g., U≈6 μm/s for a size of L≈6.5 μm. The actuation of the system can be configured to act on the magnetic Ni portion of the filament, while the rest of nanomotor can be configured to be passive. The disclosed magnetic nanomotors can be mass produced using the template electrodeposition strategy and can be functionalized (by modification of the Au segment) towards the creation of nanomachines performing practical tasks and diverse applications. In particular, the disclosed fuel-free nanowire motors could operate in a manner that can facilitate different biomedical applications, e.g., targeted drug delivery.

In another embodiment, the disclosed technology can include high-speed fuel-free magnetically-driven propellers that can exploit the flexibility of nanowires for propulsion. A magnetically-driven nanomotor (also referred to as a nanopropeller or nanoswimmer) can include a bi-segmented flexible nanowire formed of two different materials. A magnetic material can constitute one end segment (e.g., the 'tail' or 'propeller' segment). The flexible segment can constitute an end-segment and include materials in which controlled mechanical deformation can be enabled, e.g., by the motion of the (magnetic) end segment undergoing movement induced by an external rotational magnetic field. Rotational motion of the magnetic end segment can result in controlled mechanical elastic deformation of the flexible segment that breaks the system symmetry of the flexible nanopropeller, which undergoes movement in the fluid.

For example, a high-speed fuel-free magnetically-driven propeller can include a Ag—Ni metal nanowire that can be configured with a nickel 'tail' linked by a partially dissolved and weakened Ag bridge to achieve high-speed fuel-free locomotion in a fluid. These exemplary nanomotors can display both high dimensional propulsion velocities (e.g., U≈21 μm/s) and dimensionless speeds (e.g., in body lengths per revolution) when compared with natural microorganisms and other artificial propellers. The operation of these exemplary nanomotors (also referred to as nanowire swimmers) can be implemented in a real biological environment (e.g., human serum), which can emphasize the robustness of their propulsion performance and their promise for biomedical applications.

Designs, synthesis, and implementations of high-speed fuel-free flexible nanowire motors or propellers are described below and can include the following exemplary procedures.

Figure 14A:
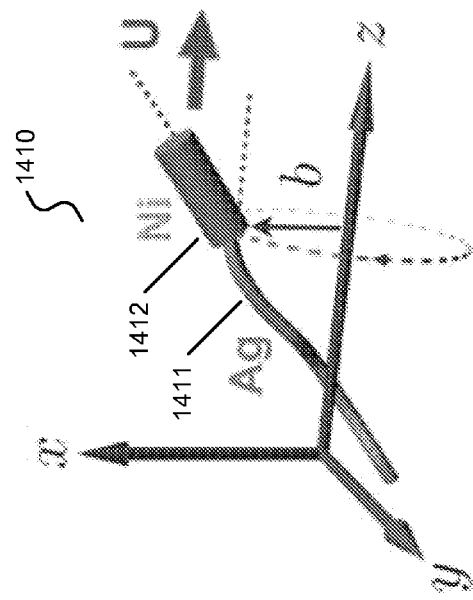
FIGS. 14A and 14B show a magnetically-propelled bi-segment nanowire motor with a flexible Ag segment and a Ni segment.

For example, a magnetically-propelled nanowire motor can be designed to have a 1.5 μm-Ni head and a 4 μm-long flexible Ag tail (as shown in the SEM image in FIG. 14A). FIG. 14A shows an exemplary flexible magnetically-propelled bi-segment nanowire motor 1400 with a silver segment 1401 and nickel segment 1402. A 0.3 μm-long Au segment can also be included (adjacent to the Ni segment) to protect the Ni segment from acid etching during the dissolution of a copper (Cu) sacrificial layer, as well as to allow functionalizing the motor with different types of biomolecules and cargos. In this design, both the Ni and Au segments can have a diameter of 200 nm. While the Ni segment can have a length of 1.5 μm that can be useful to generate sufficient magnetic torques, a very short segment of Au (e.g., 0.3 μm) can be (optionally) included in order to minimize the overall fluid drag of the nanomotor. Flexibility of the silver segment 1401 (in FIG. 14A) can be achieved by its partial dissolution, for example in a hydrogen peroxide solution (5% $H_2O_2$ for 1 min). It is noted that the dissolution step can also lead to hydroxyl products that chemisorb on the Ag surface and result in AgOH and $Ag_2O$ surface products. A dissolved Ag filament can have a reduced diameter from its initial diameter, e.g., approximately 100 nm. For practical considerations, the rigid short Au segment can be considered hydrodynamically indistinguishable from the rigid Ni segment, and hence the Ni and Au segments can be considered as a single rigid 1.8 μm-long segment (e.g., 1.5 μm Ni+0.3 μm Au), such that the exemplary nanomotor has a total length of 5.8 μm.

Figure 14B:
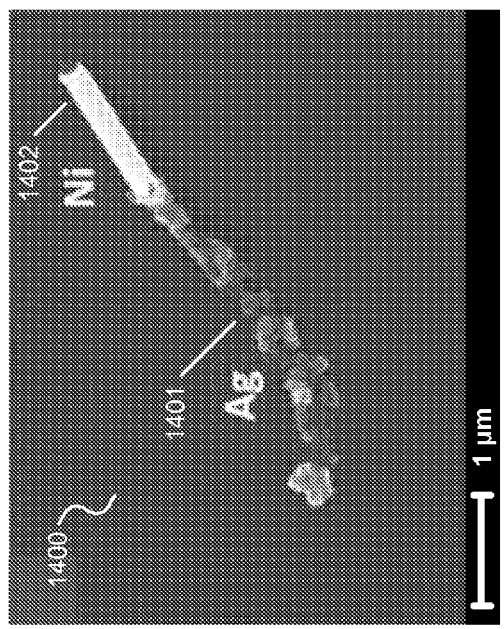

FIG. 14B illustrates a schematic representation of an exemplary flexible magnetically-propelled Ni-Ag nanowire motor 1410 that can locomote in a fluid under the presence of an external magnetic field. Nanowire motor 1410 can include a magnetic Ni segment 1412 as a rigid slender rod (e.g., radius=100 nm, length=1.8 μm) and a flexible Ag segment 1411 as a classical Euler-Bernoulli beam (e.g., radius=50 nm, length=4 μm). A rotating magnetic field can be applied such that a transfer of the magnetic energy into cyclic mechanical deformations can occur (e.g., generated by the Ag segment 1411), which can create a cone shaped rotation of the Ni segment 1412 (e.g., clockwise about the z-axis) that can result in the nanowire motor 1410 moving (e.g., with a velocity U in the z-direction).

The nanowire motors can be prepared using a template-directed electrodeposition protocol. For example, a silver film can first be sputtered on one side of the porous alumina membrane template containing 200 nm diameter cylindrical pores and 25 mm diameter to serve as a working electrode. The membrane can then be assembled in a plating cell with an aluminum foil serving as a contact for the sputtered silver. Copper can be electrodeposited in the branch area of the membrane from a 1M $CuSO_4.5H_2O$ solution, using a charge of 8 C and a potential of −0.9 V (vs. Ag/AgCl reference electrode, along with a Pt-wire counter electrode); subsequently, gold can be plated next from a gold plating solution (e.g., Orotemp 24 RTU RACK; Technic Inc.) at −0.9 V (vs. Ag/AgCl), using a charge of 0.5 C, which can be used for protecting the Ni while dissolving the membrane later; nickel can be deposited from a nickel plating solution containing 20 $gL^{-1}NiCl_2.6H_2O$, 515 $gL^{-1}$ $Ni(H_2NSO_3)_2.4H_2O$, and 20 $gL^{-1}$ $H_3BO_3$ at −1.0 V (vs. Ag/AgCl) for 6 C; and finally, silver can be plated subsequently at −0.9 V (vs. Ag/AgCl) for a total charge of 4.5 C using a silver plating solution (e.g., 1025 RTU @ 4.5 Troy/gallon; Technic Inc., Anaheim, Calif.). The sputtered silver layer can be mechanically removed from the membrane by polishing with 3-4 μm alumina particles; and the copper sacrificial layer can be dissolved using 20% HCl and 0.5 M $CuCl_2$. The membrane can then be dissolved in a 3 M NaOH solution for 30 minutes to completely release the nanowires. The nanowires can be collected by centrifugation at 6000 rpm for 5 minutes and can be washed repeatedly with nanopure water (18.2 MΩ.cm) until a neutral pH is achieved. All nanowire solutions can be stored in nanopure water at room temperature. Flexibility of the silver segment can be achieved by its partial dissolution accomplished by mixing 10 μL of the diluted Ni—Ag nanowire solution with 10 μL of the 10% hydrogen peroxide solution for 1 minute. The nanowires can then be washed under optical microscope using nanopure water (18.2 MΩ.cm) until a neutral pH is achieved.

A magnetic field can be achieved by a triaxial Helmholtz coil, including one homogeneous rotating magnetic field and a constant magnetic field which is perpendicular to the axis of the rotating one. The magnetic induction can be measured using a Gaussmeter (e.g., Model 475 DSP Gaussmeter, Lake Shore Cryotronics, Inc, Westerville, Ohio). The locomotion of nanomotor in human serum samples can be carried out by mixing directly with the nanomotor solution (1:1 ratio). Other equipment that can be used can include the following. Template electrochemical deposition of nanowires can be carried out with a CHI 621A potentiostat (CH Instruments, Austin, Tex.). Scanning electron microscopy (SEM) images can be obtained with Phillips XL30 ESEM instrument using an acceleration potential of 20 kV. Tracking of magnetically-driven nanowire motors can be performed. For example, a system for tracking nanowire motors can include an imaging device, such as an inverted optical microscope (e.g., Nikon Instrument Inc. Ti-S/L100), which can be equipped with a 40× objective and a Photometrics QuantEM 512/SC camera (Roper Scientific, Duluth, Ga.). The system for tracking nanowire motors can include modules for data processing, data storage and data transfer, including software for capturing and analyzing video and still images, e.g., Meta-Morph 7.6 software (Molecular Devices, Sunnyvale, Calif., USA), which can be used for capturing video clips at a rate, for example, of 30 frames per second. The speed of the nanomotors can be tracked using a Metamorph tracking module and the results can be statistically analyzed using Origin software.

The speed measured in this manner is a time-averaged distance travelled per unit time. The measurements can be performed when the nanomotors had reached an equilibrium position (in which case the image of the nanowire would stay focused under the microscope), which can lead therefore to the time-averaged measurement of U in the frame.

The equilibrium distance between the nanomotor and the bottom surface can be estimated, by varying the focal plane of the microscope, to be at the scale of a few microns.

A prototype based on the Ni—Ag nanowire motor design was tested to have an improved propulsion performance, e.g., U≈21 nm/s at an actuation frequency (f) of 35 Hz. The nanomotor of this design is a flexible propeller, which can exploit the deformation of flexible filaments for propulsion. The exemplary flexible propeller can approach the speed of natural microscopic swimmers, such as *Escherichia coli* (U≈30 μm/s at f=100 Hz) while using a lower frequency. The effect of size and frequency can be scaled off by nondimensionalizing the propulsion speed by the intrinsic velocity scale (the product of body length and frequency, Lf) to obtain a dimensionless propulsion speed, U/Lf, which can be interpreted as the number of body lengths travelled per revolution of actuation (or also referred to as the stride length in terms of body length).

Figure 15:
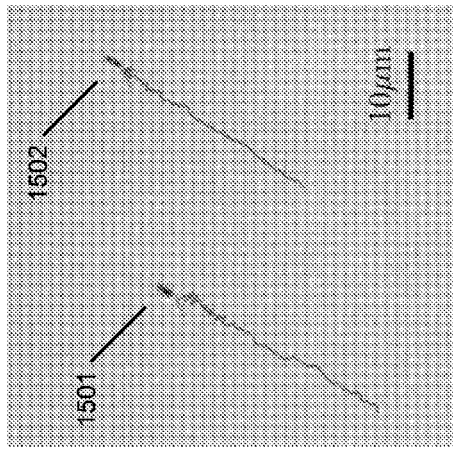
FIG. 15 shows two identical $Ag_{flex}$—Ni nanowire motors under a magnetic field.

The flexible nanomotors can be driven by a magnetic field with an unsteady component of amplitude $H_1$, rotating sinusoidally in a plane perpendicular to a constant component, $H_0$. The magnetic field can be precessed about the direction of the constant magnetic field at an angular frequency $\Omega=2\pi f$. The nanomotor can be observed to propel unidirectionally (straight trajectories) in the direction of the constant magnetic field. FIG. 15 shows two exemplary identical nanomotors 1501 and 1502 under the actuation of the external magnetic field at f=20 Hz. The red lines in FIG. 15 display the superimposed location of the nanomotors over a 2-second interval. These two nanowires 1501 and 1502 can propel at essentially the same swimming speed along the same direction (the red lines represent their trajectories in a period of 2 s), illustrating the stability of this mode of propulsion. The exemplary flexible nanowire motors 1501 and 1502 can exhibit uni-directional swimming, independent of the rotational direction of the external magnetic field. This can be due to the nonlinear swimming kinematics arising from the flexibility of the nanowire. This is in contrast with helical propellers, in which swimming can be due to the rotation of rigid chiral objects, and hence the swimming kinematics can scale linearly with the applied field—a reversal of the direction of rotation of the magnetic field can lead to propulsion in the opposite direction for these rigid chiral objects. The exemplary implementation featured in FIG. 15 can illustrate the fundamental difference between the propulsion of rigid chiral objects and flexible propellers. In the case of the exemplary flexible nanowire motors 1501 and 1502, the direction of swimming can be controlled by altering the orientation of the axial constant component of the magnetic field, $H_0$.

FIG. 16A further illustrates the motion trajectories of a nanomotor 1601 (similarly-devised as nanomotors 1501 and 1502 in FIG. 15), in which nanomotor 1601 is operated at different frequencies. The motion trajectories 1605, 1606, 1607, and 1608 in FIG. 16A are shown as superimposed red lines of the same Ni—Ag nanomotor at different frequencies f=5 Hz (for trajectory 1605), f=10 Hz (for trajectory 1606), f=15 Hz (for trajectory 1607), and f=30 Hz (for trajectory 1608). The motion trajectories represent the distance travelled by nanomotor 1601 over a 3-second period with $H_1=10$ G and $H_0=9.5$ G. At the 15 Hz frequency, the nanomotor 1601 was able to achieve a propulsion speed of U=14.3±2.46 μm/s. In this exemplary experimental implementation, the speed of 20 different nanomotors was measured, with all other experimental conditions kept fixed; the values of the swimming speeds, U, reported in FIGS. 16A and 16B represent averaged quantities over these different nanomotors.

One method for comparing the propulsion speed between various propeller designs is based on scaling the speed with the only intrinsic characteristic velocity scale of the propeller Lf, where L is a characteristic body length, and f is a characteristic frequency. This method can quantify the distance travelled by the propeller in terms of body lengths per revolution of rotation. For example, *Escherichia coli* bacteria typically propel with U/Lf≈0.03 body lengths per revolution, while the flexible nanomotor reported in FIG. 16A was able to travel 0.164 body lengths per revolution at f=15 Hz. The maximum dimensional speed achieved can be U=20.8±3.07 μm/s with f=35 Hz, corresponding in that case to ≈0.1 body lengths per revolution. Measured speed-frequency characteristics of these flexible nanowire motors are shown in FIG. 16B.

FIG. 16B show exemplary results that exhibit dependence of the nanomotor swimming speed on the actuation frequency. Under fixed rotating and constant magnetic field strengths, the swimming speed of the nanomotor was measured with the frequency of the magnetic field varied between 0 to 40 Hz. The exemplary experiment was repeated for three different settings of magnetic field strengths (symbols with error bars). The symbols (e.g., squares, circles, and diamonds) featured in FIG. 16B plot represent experimental data for different setups of the magnetic field: specifically, blue squares represent ($H_1=10$ G, $H_0=9.5$ G); red circles represent ($H_1=10$ G, $H_0=11.8$ G); and green diamonds represent ($H_1=10$ G, $H_0=14.3$ G). Error bars show standard deviations of the measured speeds (e.g., 20 samples). The solids lines show a theoretical predictions with $A=3.6\times10^{-24}$ N·m².

There are a number of advantages of these flexible nanomotors. For example, the fabrication process can be relatively reasonable to perform, which can involve a template-directed electrodeposition protocol of nanowires. Also, the nanowire swimmers are able to propel at a remarkably high speed (≈21 μm/s), which can be currently the fastest fuel-free swimmers in terms of body lengths per revolution compared with other micro/nano-swimmers. Additionally, the nanowire swimmers can be actuated by external magnetic field and do not require additional chemicals (fuels) from the environment for propulsion, which is more preferable for real biomedical applications. The nanowire swimmers have higher propulsion speeds and are capable of locomotion in high-salt environments, which is the case for many biological environments. The performance of the nanomotors described in this patent document is not affected by the salt level, and they are able to propel equally well in real biological settings.

FIG. 17 shows exemplary time lapse images of flexible fuel-free magnetically-propelled nanowire motors placed in human serum. The time lapse images demonstrate motion trajectories 1705, 1706, 1707, and 1708 of the motion of a nanowire swimmer 1701 in human serum taken at 0, 0.5, 1, and 1.5 seconds, respectively. The conditions of the exemplary experiment include f=15 Hz with $H_1=10$ G and $H_0=9.5$ G. The nanowire swimmer 1701 exhibited an average speed of U=15 μm/s. Similar propulsion behaviors can be observed from these exemplary results to those in non-biological fluids. The exemplary results in FIG. 17 can demonstrate the great potential of these flexible nanomotors in future biomedical applications, such as targeted drug delivery systems.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Only a few implementations and examples are described and other implementations, enhancements and variations can be made based on what is described and illustrated in this patent document.

What is claimed is:

1. A system for locomoting a nanostructure, comprising:
a nanostructure configured as a nanowire diode formed of two or more segments of different electrically conducting materials;
a container that contains a fluid surrounding the nanostructure; and
a mechanism that produces an electric field in the fluid that drives the nanostructure to locomote in the fluid.

2. The system of claim 1, wherein the nanostructure locomotes in the fluid substantially free of a chemical reaction with the two or more segments of the nanostructure.

3. The system of claim 1, wherein the nanowire diode comprises at least one semiconductor segment and a conductor segment.

4. The system of claim 3, wherein the at least one semiconductor segment comprises a polypyrrole (PPy) segment and the conductor segment comprises a cadmium (Cd) segment.

5. The system of claim 3, wherein the at least one semiconductor segment comprises a cadmium selenide (CdSe) segment and the conductor segment comprises a gold (Au) segment.

6. The system of claim 1, wherein the mechanism for producing an electric field includes electrodes and an AC signal source coupled to the electrodes.

7. The system of claim 1, wherein the electric field comprises an alternating electric field that is at least one of a uniform alternating electric field or a non-uniform alternating electric field.

8. The system of claim 1, wherein the fluid comprises at least one of pure water, salt concentrated water, and biological fluid.

9. The system of claim 1, further comprising a system for tracking a locomotion pattern of the nanostructure in the fluid.

10. A system for locomoting a nanostructure, comprising:
a nanostructure configured as a multi-segment nanowire formed of a joint segment that includes a flexible material and a propeller segment that includes a magnetic material;
a container that contains a fluid surrounding the nanostructure; and
a mechanism that generates and controls a magnetic field in the fluid that drives the nanostructure to locomote in the fluid.

11. The system of claim 10, wherein the nanostructure locomotes in the fluid substantially free of a chemical reaction with the multi-segment nanowire.

12. The system of claim 10, wherein the magnetic field comprises a rotational magnetic field that rotates the propeller segment, thereby creating a controlled elastic deformation of the joint segment in an asymmetrical manner, whereby the magnetic field drives the nanostructure to locomote in the fluid.

13. The system of claim 10, wherein the joint segment comprises at least one of a metal or a polymeric material.

14. The system of claim 10, wherein the joint segment comprises a flexible silver (Ag) or polymer segment, and the propeller segment comprises a nickel (Ni) or iron oxide ($Fe_2O_3$) segment.

15. The system of claim 10, wherein the mechanism for producing a magnetic field includes at least one of a rotating magnet that produces a rotational magnetic field and a static magnet that produces a static magnetic field.

16. The system of claim 10, wherein the multi-segment nanowire further includes a head segment.

17. The system of claim 16, wherein the head segment comprises a gold (Au) segment.

18. The system of claim 16, wherein the head segment and the propeller segment are configured to each have a particular length for a direction control of the nanostructure to locomote in the fluid.

19. The system of claim 10, wherein the mechanism for producing a magnetic field is modulated for an on/off control and a direction control of the nanostructure to locomote in the fluid.

20. The system of claim 10, wherein the fluid comprises at least one of pure water, salt concentrated water, and biological fluid.

21. The system of claim 10, further comprising a system for tracking a locomotion pattern of the nanostructure in the fluid.

22. A nanowire diode that locomotes in a fluid under an electric field, comprising:
two or more segments formed of at least one semiconductor segment and a conductor segment that are structured and interfaced to form a diode that interacts with an external electric field to locomote in a fluid while being substantially free of a chemical reaction with the two or more segments of the nanowire diode.

23. A nanowire that locomotes in a fluid under a magnetic field, comprising:
two or more segments coupled to allow motion relative to one another, wherein at least one segment is formed of a magnetic material and at least one segment is formed of a flexible material that moves relative to the magnetic material when the magnetic material interacts with an external magnetic field to cause locomotion of the nanowire in a fluid substantially free of a chemical reaction with the two or more segments of the nanowire.

* * * * *